US008334884B2

(12) United States Patent
Kato

(10) Patent No.: US 8,334,884 B2
(45) Date of Patent: Dec. 18, 2012

(54) METHOD OF CALCULATING CORRECTION VALUE AND DISPLAY DEVICE

(75) Inventor: Yasunobu Kato, Kanagawa (JP)

(73) Assignee: Sony Corporation, Tokyo (JP)

( * ) Notice: Subject to any disclaimer, the term of this patent is extended or adjusted under 35 U.S.C. 154(b) by 616 days.

(21) Appl. No.: 12/591,285

(22) Filed: Nov. 16, 2009

(65) Prior Publication Data

US 2010/0128053 A1 May 27, 2010

(30) Foreign Application Priority Data

Nov. 25, 2008 (JP) ................................ 2008-299714

(51) Int. Cl.

| | |
|---|---|
| ***G09G 3/20*** | (2006.01) |
| ***G09G 3/30*** | (2006.01) |
| ***G09G 5/00*** | (2006.01) |
| ***H04N 5/202*** | (2006.01) |
| ***H04N 5/14*** | (2006.01) |
| ***H04N 9/77*** | (2006.01) |
| ***H04N 1/40*** | (2006.01) |
| ***G03F 3/08*** | (2006.01) |
| ***G06K 9/40*** | (2006.01) |

(52) U.S. Cl. .......... 345/690; 345/602; 345/589; 345/58; 345/77; 345/581; 348/254; 348/671; 348/712; 358/520; 358/522; 358/525; 358/447; 382/254; 382/274

(58) Field of Classification Search .................. 345/581, 345/589–591, 593–594, 600–602, 606, 643, 345/204, 690, 58, 63, 77, 84, 88, 547–549; 348/223.1, 251, 254, 571, 602–603, 627, 348/631, 645, 649, 671–674, 687, 712, 739; 358/518–520, 522–525, 447–448; 382/254, 382/274

See application file for complete search history.

(56) References Cited

U.S. PATENT DOCUMENTS

2002/0154076 A1* 10/2002 Greene et al. .................. 345/87
2004/0208366 A1* 10/2004 Kuwata .......................... 382/171
2009/0015728 A1* 1/2009 Abe et al. ...................... 348/739

FOREIGN PATENT DOCUMENTS

JP 2002-055675 A 2/2002

(Continued)

OTHER PUBLICATIONS

Japanese Office Action issued Sep. 28, 2010 for corresponding Japanese Application No. 2008-299714.

(Continued)

*Primary Examiner* — Wesner Sajous

(74) *Attorney, Agent, or Firm* — Rader Fishman & Grauer, PLLC

(57) ABSTRACT

A method of calculating a correction value used when signal value correction is performed with respect to an image signal supplied to a display panel includes setting a target luminance value, which is not uniform in an overall surface of the display panel, as a target luminance value of one image signal value such that at least a portion of a distribution of target luminance values at each plane position of the display panel becomes a curved distribution, and calculating a correction value at each plane position of the display panel using luminance observed at each plane position of the display panel when one image signal value is given to the overall surface of the display panel and the target luminance value at each plane position of the display panel.

9 Claims, 30 Drawing Sheets

FOREIGN PATENT DOCUMENTS

| | | | |
|---|---|---|---|
| JP | 2004-240186 | A | 8/2004 |
| JP | 2005-134475 | A | 5/2005 |
| JP | 2005-195832 | | 7/2005 |
| JP | 2007-088980 | A | 4/2007 |
| JP | 2007-219062 | A | 8/2007 |
| JP | 2008-158399 | A | 7/2008 |

OTHER PUBLICATIONS

Japanese Office Action issued Nov. 30, 2011 for corresponding Japanese Application No. 2008-299714.

* cited by examiner

LUMINANCE
LP1
TG1
PANEL POSITION x

CORRECTION VALUE
(MAXIMUM GRAYSCALE) 1023
H1
PANEL POSITION x
CORRECTABLE
LOW-LUMINANCE AREA

LUMINANCE
LP2
TG2
PANEL POSITION x

CORRECTION VALUE
1023
H2
PANEL POSITION x
CORRECTABLE
INTERMEDIATE-LUMINANCE AREA

LUMINANCE
LP3
TG3
PANEL POSITION x

CORRECTION VALUE
1023
H3
PANEL POSITION x
CORRECTABLE
HIGH-LUMINANCE AREA

FIG. 6

| | -1.6 | -1.5 | -1.4 | -1.3 | -1.2 | -1.1 | -1 | -0.9 | -0.8 | -0.7 | -0.6 | -0.5 | -0.4 | -0.3 | -0.2 | -0.1 | 0 | 0.1 | 0.2 | 0.3 | 0.4 | 0.5 | 0.6 | 0.7 | 0.8 | 0.9 | 1 | 1.1 | 1.2 | 1.3 | 1.4 | 1.5 | 1.6 |
|---|---|---|---|---|---|---|---|---|---|---|---|---|---|---|---|---|---|---|---|---|---|---|---|---|---|---|---|---|---|---|---|---|---|
| -0.9 | 8 | 8.121 | 8.234 | 8.34 | 8.438 | 8.527 | 8.609 | 8.684 | 8.75 | 8.809 | 8.859 | 8.902 | 8.938 | 8.965 | 8.984 | 8.996 | 9 | 8.996 | 8.984 | 8.965 | 8.938 | 8.902 | 8.859 | 8.809 | 8.75 | 8.684 | 8.609 | 8.527 | 8.438 | 8.34 | 8.234 | 8.121 | 8 |
| -0.8 | 8.21 | 8.331 | 8.444 | 8.55 | 8.647 | 8.737 | 8.819 | 8.893 | 8.96 | 9.018 | 9.069 | 9.112 | 9.147 | 9.175 | 9.194 | 9.206 | 9.21 | 9.206 | 9.194 | 9.175 | 9.147 | 9.112 | 9.069 | 9.018 | 8.96 | 8.893 | 8.819 | 8.737 | 8.647 | 8.55 | 8.444 | 8.331 | 8.21 |
| -0.7 | 8.395 | 8.516 | 8.629 | 8.735 | 8.833 | 8.922 | 9.004 | 9.079 | 9.145 | 9.204 | 9.254 | 9.297 | 9.333 | 9.36 | 9.379 | 9.391 | 9.395 | 9.391 | 9.379 | 9.36 | 9.333 | 9.297 | 9.254 | 9.204 | 9.145 | 9.079 | 9.004 | 8.922 | 8.833 | 8.735 | 8.629 | 8.516 | 8.395 |
| -0.6 | 8.556 | 8.677 | 8.79 | 8.895 | 8.993 | 9.083 | 9.165 | 9.239 | 9.306 | 9.364 | 9.415 | 9.458 | 9.493 | 9.52 | 9.54 | 9.552 | 9.556 | 9.552 | 9.54 | 9.52 | 9.493 | 9.458 | 9.415 | 9.364 | 9.306 | 9.239 | 9.165 | 9.083 | 8.993 | 8.895 | 8.79 | 8.677 | 8.556 |
| -0.5 | 8.691 | 8.812 | 8.926 | 9.031 | 9.129 | 9.219 | 9.301 | 9.375 | 9.441 | 9.5 | 9.551 | 9.594 | 9.629 | 9.656 | 9.676 | 9.687 | 9.691 | 9.687 | 9.676 | 9.656 | 9.629 | 9.594 | 9.551 | 9.5 | 9.441 | 9.375 | 9.301 | 9.219 | 9.129 | 9.031 | 8.926 | 8.812 | 8.691 |
| -0.4 | 8.802 | 8.924 | 9.037 | 9.142 | 9.24 | 9.33 | 9.412 | 9.486 | 9.552 | 9.611 | 9.662 | 9.705 | 9.74 | 9.767 | 9.787 | 9.799 | 9.802 | 9.799 | 9.787 | 9.767 | 9.74 | 9.705 | 9.662 | 9.611 | 9.552 | 9.486 | 9.412 | 9.33 | 9.24 | 9.142 | 9.037 | 8.924 | 8.802 |
| -0.3 | 8.889 | 9.01 | 9.123 | 9.229 | 9.326 | 9.416 | 9.498 | 9.572 | 9.639 | 9.697 | 9.748 | 9.791 | 9.826 | 9.854 | 9.873 | 9.885 | 9.889 | 9.885 | 9.873 | 9.854 | 9.826 | 9.791 | 9.748 | 9.697 | 9.639 | 9.572 | 9.498 | 9.416 | 9.326 | 9.229 | 9.123 | 9.01 | 8.889 |
| -0.2 | 8.951 | 9.072 | 9.185 | 9.29 | 9.388 | 9.478 | 9.56 | 9.634 | 9.701 | 9.759 | 9.81 | 9.853 | 9.888 | 9.915 | 9.935 | 9.947 | 9.951 | 9.947 | 9.935 | 9.915 | 9.888 | 9.853 | 9.81 | 9.759 | 9.701 | 9.634 | 9.56 | 9.478 | 9.388 | 9.29 | 9.185 | 9.072 | 8.951 |
| -0.1 | 8.988 | 9.109 | 9.222 | 9.327 | 9.425 | 9.515 | 9.597 | 9.671 | 9.738 | 9.796 | 9.847 | 9.89 | 9.925 | 9.952 | 9.972 | 9.984 | 9.988 | 9.984 | 9.972 | 9.952 | 9.925 | 9.89 | 9.847 | 9.796 | 9.738 | 9.671 | 9.597 | 9.515 | 9.425 | 9.327 | 9.222 | 9.109 | 8.988 |
| 0 | 9 | 9.121 | 9.234 | 9.34 | 9.438 | 9.527 | 9.609 | 9.684 | 9.75 | 9.809 | 9.859 | 9.902 | 9.938 | 9.965 | 9.984 | 9.996 | 10 | 9.996 | 9.984 | 9.965 | 9.938 | 9.902 | 9.859 | 9.809 | 9.75 | 9.684 | 9.609 | 9.527 | 9.438 | 9.34 | 9.234 | 9.121 | 9 |
| 0.1 | 8.988 | 9.109 | 9.222 | 9.327 | 9.425 | 9.515 | 9.597 | 9.671 | 9.738 | 9.796 | 9.847 | 9.89 | 9.925 | 9.952 | 9.972 | 9.984 | 9.988 | 9.984 | 9.972 | 9.952 | 9.925 | 9.89 | 9.847 | 9.796 | 9.738 | 9.671 | 9.597 | 9.515 | 9.425 | 9.327 | 9.222 | 9.109 | 8.988 |
| 0.2 | 8.951 | 9.072 | 9.185 | 9.29 | 9.388 | 9.478 | 9.56 | 9.634 | 9.701 | 9.759 | 9.81 | 9.853 | 9.888 | 9.915 | 9.935 | 9.947 | 9.951 | 9.947 | 9.935 | 9.915 | 9.888 | 9.853 | 9.81 | 9.759 | 9.701 | 9.634 | 9.56 | 9.478 | 9.388 | 9.29 | 9.185 | 9.072 | 8.951 |
| 0.3 | 8.889 | 9.01 | 9.123 | 9.229 | 9.326 | 9.416 | 9.498 | 9.572 | 9.639 | 9.697 | 9.748 | 9.791 | 9.826 | 9.854 | 9.873 | 9.885 | 9.889 | 9.885 | 9.873 | 9.854 | 9.826 | 9.791 | 9.748 | 9.697 | 9.639 | 9.572 | 9.498 | 9.416 | 9.326 | 9.229 | 9.123 | 9.01 | 8.889 |
| 0.4 | 8.802 | 8.924 | 9.037 | 9.142 | 9.24 | 9.33 | 9.412 | 9.486 | 9.552 | 9.611 | 9.662 | 9.705 | 9.74 | 9.767 | 9.787 | 9.799 | 9.802 | 9.799 | 9.787 | 9.767 | 9.74 | 9.705 | 9.662 | 9.611 | 9.552 | 9.486 | 9.412 | 9.33 | 9.24 | 9.142 | 9.037 | 8.924 | 8.802 |
| 0.5 | 8.691 | 8.812 | 8.926 | 9.031 | 9.129 | 9.219 | 9.301 | 9.375 | 9.441 | 9.5 | 9.551 | 9.594 | 9.629 | 9.656 | 9.676 | 9.687 | 9.691 | 9.687 | 9.676 | 9.656 | 9.629 | 9.594 | 9.551 | 9.5 | 9.441 | 9.375 | 9.301 | 9.219 | 9.129 | 9.031 | 8.926 | 8.812 | 8.691 |
| 0.6 | 8.556 | 8.677 | 8.79 | 8.895 | 8.993 | 9.083 | 9.165 | 9.239 | 9.306 | 9.364 | 9.415 | 9.458 | 9.493 | 9.52 | 9.54 | 9.552 | 9.556 | 9.552 | 9.54 | 9.52 | 9.493 | 9.458 | 9.415 | 9.364 | 9.306 | 9.239 | 9.165 | 9.083 | 8.993 | 8.895 | 8.79 | 8.677 | 8.556 |
| 0.7 | 8.395 | 8.516 | 8.629 | 8.735 | 8.833 | 8.922 | 9.004 | 9.079 | 9.145 | 9.204 | 9.254 | 9.297 | 9.333 | 9.36 | 9.379 | 9.391 | 9.395 | 9.391 | 9.379 | 9.36 | 9.333 | 9.297 | 9.254 | 9.204 | 9.145 | 9.079 | 9.004 | 8.922 | 8.833 | 8.735 | 8.629 | 8.516 | 8.395 |
| 0.8 | 8.21 | 8.331 | 8.444 | 8.55 | 8.647 | 8.737 | 8.819 | 8.893 | 8.96 | 9.018 | 9.069 | 9.112 | 9.147 | 9.175 | 9.194 | 9.206 | 9.21 | 9.206 | 9.194 | 9.175 | 9.147 | 9.112 | 9.069 | 9.018 | 8.96 | 8.893 | 8.819 | 8.737 | 8.647 | 8.55 | 8.444 | 8.331 | 8.21 |
| 0.9 | 8 | 8.121 | 8.234 | 8.34 | 8.438 | 8.527 | 8.609 | 8.684 | 8.75 | 8.809 | 8.859 | 8.902 | 8.938 | 8.965 | 8.984 | 8.996 | 9 | 8.996 | 8.984 | 8.965 | 8.938 | 8.902 | 8.859 | 8.809 | 8.75 | 8.684 | 8.609 | 8.527 | 8.438 | 8.34 | 8.234 | 8.121 | 8 |

FIG. 7

| | -1.6 | -1.5 | -1.4 | -1.3 | -1.2 | -1.1 | -1 | -0.9 | -0.8 | -0.7 | -0.6 | -0.5 | -0.4 | -0.3 | -0.2 | -0.1 | 0 | 0.1 | 0.2 | 0.3 | 0.4 | 0.5 | 0.6 | 0.7 | 0.8 | 0.9 | 1 | 1.1 | 1.2 | 1.3 | 1.4 | 1.5 | 1.6 |
|---|---|---|---|---|---|---|---|---|---|---|---|---|---|---|---|---|---|---|---|---|---|---|---|---|---|---|---|---|---|---|---|---|---|
| -0.9 | 8 | 8.098 | 8.195 | 8.29 | 8.383 | 8.471 | 8.556 | 8.634 | 8.707 | 8.773 | 8.831 | 8.882 | 8.924 | 8.957 | 8.981 | 8.995 | 9 | 8.995 | 8.981 | 8.957 | 8.924 | 8.882 | 8.831 | 8.773 | 8.707 | 8.634 | 8.556 | 8.471 | 8.383 | 8.29 | 8.195 | 8.098 | 8 |
| -0.8 | 8.174 | 8.272 | 8.369 | 8.464 | 8.556 | 8.645 | 8.729 | 8.808 | 8.881 | 8.947 | 9.005 | 9.056 | 9.098 | 9.131 | 9.154 | 9.169 | 9.174 | 9.169 | 9.154 | 9.131 | 9.098 | 9.056 | 9.005 | 8.947 | 8.881 | 8.808 | 8.729 | 8.645 | 8.556 | 8.464 | 8.369 | 8.272 | 8.174 |
| -0.7 | 8.342 | 8.44 | 8.537 | 8.632 | 8.725 | 8.813 | 8.898 | 8.976 | 9.049 | 9.115 | 9.173 | 9.224 | 9.266 | 9.299 | 9.323 | 9.337 | 9.342 | 9.337 | 9.323 | 9.299 | 9.266 | 9.224 | 9.173 | 9.115 | 9.049 | 8.976 | 8.898 | 8.813 | 8.725 | 8.632 | 8.537 | 8.44 | 8.342 |
| -0.6 | 8.5 | 8.598 | 8.695 | 8.79 | 8.883 | 8.971 | 9.056 | 9.134 | 9.207 | 9.273 | 9.331 | 9.382 | 9.424 | 9.457 | 9.481 | 9.495 | 9.5 | 9.495 | 9.481 | 9.457 | 9.424 | 9.382 | 9.331 | 9.273 | 9.207 | 9.134 | 9.056 | 8.971 | 8.883 | 8.79 | 8.695 | 8.598 | 8.5 |
| -0.5 | 8.643 | 8.741 | 8.838 | 8.933 | 9.025 | 9.114 | 9.198 | 9.277 | 9.35 | 9.416 | 9.474 | 9.525 | 9.567 | 9.6 | 9.624 | 9.638 | 9.643 | 9.638 | 9.624 | 9.6 | 9.567 | 9.525 | 9.474 | 9.416 | 9.35 | 9.277 | 9.198 | 9.114 | 9.025 | 8.933 | 8.838 | 8.741 | 8.643 |
| -0.4 | 8.766 | 8.864 | 8.961 | 9.056 | 9.149 | 9.237 | 9.322 | 9.4 | 9.473 | 9.539 | 9.598 | 9.648 | 9.69 | 9.723 | 9.747 | 9.761 | 9.766 | 9.761 | 9.747 | 9.723 | 9.69 | 9.648 | 9.598 | 9.539 | 9.473 | 9.4 | 9.322 | 9.237 | 9.149 | 9.056 | 8.961 | 8.864 | 8.766 |
| -0.3 | 8.866 | 8.964 | 9.061 | 9.156 | 9.249 | 9.337 | 9.422 | 9.5 | 9.573 | 9.639 | 9.697 | 9.748 | 9.79 | 9.823 | 9.847 | 9.861 | 9.866 | 9.861 | 9.847 | 9.823 | 9.79 | 9.748 | 9.697 | 9.639 | 9.573 | 9.5 | 9.422 | 9.337 | 9.249 | 9.156 | 9.061 | 8.964 | 8.866 |
| -0.2 | 8.94 | 9.038 | 9.135 | 9.23 | 9.322 | 9.411 | 9.495 | 9.574 | 9.647 | 9.713 | 9.771 | 9.822 | 9.864 | 9.897 | 9.92 | 9.935 | 9.94 | 9.935 | 9.92 | 9.897 | 9.864 | 9.822 | 9.771 | 9.713 | 9.647 | 9.574 | 9.495 | 9.411 | 9.322 | 9.23 | 9.135 | 9.038 | 8.94 |
| -0.1 | 8.985 | 9.083 | 9.18 | 9.275 | 9.367 | 9.456 | 9.54 | 9.619 | 9.692 | 9.758 | 9.816 | 9.867 | 9.909 | 9.942 | 9.966 | 9.98 | 9.985 | 9.98 | 9.966 | 9.942 | 9.909 | 9.867 | 9.816 | 9.758 | 9.692 | 9.619 | 9.54 | 9.456 | 9.367 | 9.275 | 9.18 | 9.083 | 8.985 |
| 0 | 9 | 9.098 | 9.195 | 9.29 | 9.383 | 9.471 | 9.556 | 9.634 | 9.707 | 9.773 | 9.831 | 9.882 | 9.924 | 9.957 | 9.981 | 9.995 | 10 | 9.995 | 9.981 | 9.957 | 9.924 | 9.882 | 9.831 | 9.773 | 9.707 | 9.634 | 9.556 | 9.471 | 9.383 | 9.29 | 9.195 | 9.098 | 9 |
| 0.1 | 8.985 | 9.083 | 9.18 | 9.275 | 9.367 | 9.456 | 9.54 | 9.619 | 9.692 | 9.758 | 9.816 | 9.867 | 9.909 | 9.942 | 9.966 | 9.98 | 9.985 | 9.98 | 9.966 | 9.942 | 9.909 | 9.867 | 9.816 | 9.758 | 9.692 | 9.619 | 9.54 | 9.456 | 9.367 | 9.275 | 9.18 | 9.083 | 8.985 |
| 0.2 | 8.94 | 9.038 | 9.135 | 9.23 | 9.322 | 9.411 | 9.495 | 9.574 | 9.647 | 9.713 | 9.771 | 9.822 | 9.864 | 9.897 | 9.92 | 9.935 | 9.94 | 9.935 | 9.92 | 9.897 | 9.864 | 9.822 | 9.771 | 9.713 | 9.647 | 9.574 | 9.495 | 9.411 | 9.322 | 9.23 | 9.135 | 9.038 | 8.94 |
| 0.3 | 8.866 | 8.964 | 9.061 | 9.156 | 9.249 | 9.337 | 9.422 | 9.5 | 9.573 | 9.639 | 9.697 | 9.748 | 9.79 | 9.823 | 9.847 | 9.861 | 9.866 | 9.861 | 9.847 | 9.823 | 9.79 | 9.748 | 9.697 | 9.639 | 9.573 | 9.5 | 9.422 | 9.337 | 9.249 | 9.156 | 9.061 | 8.964 | 8.866 |
| 0.4 | 8.766 | 8.864 | 8.961 | 9.056 | 9.149 | 9.237 | 9.322 | 9.4 | 9.473 | 9.539 | 9.598 | 9.648 | 9.69 | 9.723 | 9.747 | 9.761 | 9.766 | 9.761 | 9.747 | 9.723 | 9.69 | 9.648 | 9.598 | 9.539 | 9.473 | 9.4 | 9.322 | 9.237 | 9.149 | 9.056 | 8.961 | 8.864 | 8.766 |
| 0.5 | 8.643 | 8.741 | 8.838 | 8.933 | 9.025 | 9.114 | 9.198 | 9.277 | 9.35 | 9.416 | 9.474 | 9.525 | 9.567 | 9.6 | 9.624 | 9.638 | 9.643 | 9.638 | 9.624 | 9.6 | 9.567 | 9.525 | 9.474 | 9.416 | 9.35 | 9.277 | 9.198 | 9.114 | 9.025 | 8.933 | 8.838 | 8.741 | 8.643 |
| 0.6 | 8.5 | 8.598 | 8.695 | 8.79 | 8.883 | 8.971 | 9.056 | 9.134 | 9.207 | 9.273 | 9.331 | 9.382 | 9.424 | 9.457 | 9.481 | 9.495 | 9.5 | 9.495 | 9.481 | 9.457 | 9.424 | 9.382 | 9.331 | 9.273 | 9.207 | 9.134 | 9.056 | 8.971 | 8.883 | 8.79 | 8.695 | 8.598 | 8.5 |
| 0.7 | 8.342 | 8.44 | 8.537 | 8.632 | 8.725 | 8.813 | 8.898 | 8.976 | 9.049 | 9.115 | 9.173 | 9.224 | 9.266 | 9.299 | 9.323 | 9.337 | 9.342 | 9.337 | 9.323 | 9.299 | 9.266 | 9.224 | 9.173 | 9.115 | 9.049 | 8.976 | 8.898 | 8.813 | 8.725 | 8.632 | 8.537 | 8.44 | 8.342 |
| 0.8 | 8.174 | 8.272 | 8.369 | 8.464 | 8.556 | 8.645 | 8.729 | 8.808 | 8.881 | 8.947 | 9.005 | 9.056 | 9.098 | 9.131 | 9.154 | 9.169 | 9.174 | 9.169 | 9.154 | 9.131 | 9.098 | 9.056 | 9.005 | 8.947 | 8.881 | 8.808 | 8.729 | 8.645 | 8.556 | 8.464 | 8.369 | 8.272 | 8.174 |
| 0.9 | 8 | 8.098 | 8.195 | 8.29 | 8.383 | 8.471 | 8.556 | 8.634 | 8.707 | 8.773 | 8.831 | 8.882 | 8.924 | 8.957 | 8.981 | 8.995 | 9 | 8.995 | 8.981 | 8.957 | 8.924 | 8.882 | 8.831 | 8.773 | 8.707 | 8.634 | 8.556 | 8.471 | 8.383 | 8.29 | 8.195 | 8.098 | 8 |

FIG. 9

| | -1.6 | -1.5 | -1.4 | -1.3 | -1.2 | -1.1 | -1 | -0.9 | -0.8 | -0.7 | -0.6 | -0.5 | -0.4 | -0.3 | -0.2 | -0.1 | 0 | 0.1 | 0.2 | 0.3 | 0.4 | 0.5 | 0.6 | 0.7 | 0.8 | 0.9 | 1 | 1.1 | 1.2 | 1.3 | 1.4 | 1.5 | 1.6 |
|---|---|---|---|---|---|---|---|---|---|---|---|---|---|---|---|---|---|---|---|---|---|---|---|---|---|---|---|---|---|---|---|---|---|
| -0.9 | 8 | 8.242 | 8.469 | 8.68 | 8.875 | 9.055 | 9.219 | 9.367 | 9.5 | 9.617 | 9.719 | 9.805 | 9.875 | 9.93 | 9.969 | 9.992 | 10 | 9.992 | 9.969 | 9.93 | 9.875 | 9.805 | 9.719 | 9.617 | 9.5 | 9.367 | 9.219 | 9.055 | 8.875 | 8.68 | 8.469 | 8.242 | 8 |
| -0.8 | 8 | 8.242 | 8.469 | 8.68 | 8.875 | 9.055 | 9.219 | 9.367 | 9.5 | 9.617 | 9.719 | 9.805 | 9.875 | 9.93 | 9.969 | 9.992 | 10 | 9.992 | 9.969 | 9.93 | 9.875 | 9.805 | 9.719 | 9.617 | 9.5 | 9.367 | 9.219 | 9.055 | 8.875 | 8.68 | 8.469 | 8.242 | 8 |
| -0.7 | 8 | 8.242 | 8.469 | 8.68 | 8.875 | 9.055 | 9.219 | 9.367 | 9.5 | 9.617 | 9.719 | 9.805 | 9.875 | 9.93 | 9.969 | 9.992 | 10 | 9.992 | 9.969 | 9.93 | 9.875 | 9.805 | 9.719 | 9.617 | 9.5 | 9.367 | 9.219 | 9.055 | 8.875 | 8.68 | 8.469 | 8.242 | 8 |
| -0.6 | 8 | 8.242 | 8.469 | 8.68 | 8.875 | 9.055 | 9.219 | 9.367 | 9.5 | 9.617 | 9.719 | 9.805 | 9.875 | 9.93 | 9.969 | 9.992 | 10 | 9.992 | 9.969 | 9.93 | 9.875 | 9.805 | 9.719 | 9.617 | 9.5 | 9.367 | 9.219 | 9.055 | 8.875 | 8.68 | 8.469 | 8.242 | 8 |
| -0.5 | 8 | 8.242 | 8.469 | 8.68 | 8.875 | 9.055 | 9.219 | 9.367 | 9.5 | 9.617 | 9.719 | 9.805 | 9.875 | 9.93 | 9.969 | 9.992 | 10 | 9.992 | 9.969 | 9.93 | 9.875 | 9.805 | 9.719 | 9.617 | 9.5 | 9.367 | 9.219 | 9.055 | 8.875 | 8.68 | 8.469 | 8.242 | 8 |
| -0.4 | 8 | 8.242 | 8.469 | 8.68 | 8.875 | 9.055 | 9.219 | 9.367 | 9.5 | 9.617 | 9.719 | 9.805 | 9.875 | 9.93 | 9.969 | 9.992 | 10 | 9.992 | 9.969 | 9.93 | 9.875 | 9.805 | 9.719 | 9.617 | 9.5 | 9.367 | 9.219 | 9.055 | 8.875 | 8.68 | 8.469 | 8.242 | 8 |
| -0.3 | 8 | 8.242 | 8.469 | 8.68 | 8.875 | 9.055 | 9.219 | 9.367 | 9.5 | 9.617 | 9.719 | 9.805 | 9.875 | 9.93 | 9.969 | 9.992 | 10 | 9.992 | 9.969 | 9.93 | 9.875 | 9.805 | 9.719 | 9.617 | 9.5 | 9.367 | 9.219 | 9.055 | 8.875 | 8.68 | 8.469 | 8.242 | 8 |
| -0.2 | 8 | 8.242 | 8.469 | 8.68 | 8.875 | 9.055 | 9.219 | 9.367 | 9.5 | 9.617 | 9.719 | 9.805 | 9.875 | 9.93 | 9.969 | 9.992 | 10 | 9.992 | 9.969 | 9.93 | 9.875 | 9.805 | 9.719 | 9.617 | 9.5 | 9.367 | 9.219 | 9.055 | 8.875 | 8.68 | 8.469 | 8.242 | 8 |
| -0.1 | 8 | 8.242 | 8.469 | 8.68 | 8.875 | 9.055 | 9.219 | 9.367 | 9.5 | 9.617 | 9.719 | 9.805 | 9.875 | 9.93 | 9.969 | 9.992 | 10 | 9.992 | 9.969 | 9.93 | 9.875 | 9.805 | 9.719 | 9.617 | 9.5 | 9.367 | 9.219 | 9.055 | 8.875 | 8.68 | 8.469 | 8.242 | 8 |
| 0 | 8 | 8.242 | 8.469 | 8.68 | 8.875 | 9.055 | 9.219 | 9.367 | 9.5 | 9.617 | 9.719 | 9.805 | 9.875 | 9.93 | 9.969 | 9.992 | 10 | 9.992 | 9.969 | 9.93 | 9.875 | 9.805 | 9.719 | 9.617 | 9.5 | 9.367 | 9.219 | 9.055 | 8.875 | 8.68 | 8.469 | 8.242 | 8 |
| 0.1 | 8 | 8.242 | 8.469 | 8.68 | 8.875 | 9.055 | 9.219 | 9.367 | 9.5 | 9.617 | 9.719 | 9.805 | 9.875 | 9.93 | 9.969 | 9.992 | 10 | 9.992 | 9.969 | 9.93 | 9.875 | 9.805 | 9.719 | 9.617 | 9.5 | 9.367 | 9.219 | 9.055 | 8.875 | 8.68 | 8.469 | 8.242 | 8 |
| 0.2 | 8 | 8.242 | 8.469 | 8.68 | 8.875 | 9.055 | 9.219 | 9.367 | 9.5 | 9.617 | 9.719 | 9.805 | 9.875 | 9.93 | 9.969 | 9.992 | 10 | 9.992 | 9.969 | 9.93 | 9.875 | 9.805 | 9.719 | 9.617 | 9.5 | 9.367 | 9.219 | 9.055 | 8.875 | 8.68 | 8.469 | 8.242 | 8 |
| 0.3 | 8 | 8.242 | 8.469 | 8.68 | 8.875 | 9.055 | 9.219 | 9.367 | 9.5 | 9.617 | 9.719 | 9.805 | 9.875 | 9.93 | 9.969 | 9.992 | 10 | 9.992 | 9.969 | 9.93 | 9.875 | 9.805 | 9.719 | 9.617 | 9.5 | 9.367 | 9.219 | 9.055 | 8.875 | 8.68 | 8.469 | 8.242 | 8 |
| 0.4 | 8 | 8.242 | 8.469 | 8.68 | 8.875 | 9.055 | 9.219 | 9.367 | 9.5 | 9.617 | 9.719 | 9.805 | 9.875 | 9.93 | 9.969 | 9.992 | 10 | 9.992 | 9.969 | 9.93 | 9.875 | 9.805 | 9.719 | 9.617 | 9.5 | 9.367 | 9.219 | 9.055 | 8.875 | 8.68 | 8.469 | 8.242 | 8 |
| 0.5 | 8 | 8.242 | 8.469 | 8.68 | 8.875 | 9.055 | 9.219 | 9.367 | 9.5 | 9.617 | 9.719 | 9.805 | 9.875 | 9.93 | 9.969 | 9.992 | 10 | 9.992 | 9.969 | 9.93 | 9.875 | 9.805 | 9.719 | 9.617 | 9.5 | 9.367 | 9.219 | 9.055 | 8.875 | 8.68 | 8.469 | 8.242 | 8 |
| 0.6 | 8 | 8.242 | 8.469 | 8.68 | 8.875 | 9.055 | 9.219 | 9.367 | 9.5 | 9.617 | 9.719 | 9.805 | 9.875 | 9.93 | 9.969 | 9.992 | 10 | 9.992 | 9.969 | 9.93 | 9.875 | 9.805 | 9.719 | 9.617 | 9.5 | 9.367 | 9.219 | 9.055 | 8.875 | 8.68 | 8.469 | 8.242 | 8 |
| 0.7 | 8 | 8.242 | 8.469 | 8.68 | 8.875 | 9.055 | 9.219 | 9.367 | 9.5 | 9.617 | 9.719 | 9.805 | 9.875 | 9.93 | 9.969 | 9.992 | 10 | 9.992 | 9.969 | 9.93 | 9.875 | 9.805 | 9.719 | 9.617 | 9.5 | 9.367 | 9.219 | 9.055 | 8.875 | 8.68 | 8.469 | 8.242 | 8 |
| 0.8 | 8 | 8.242 | 8.469 | 8.68 | 8.875 | 9.055 | 9.219 | 9.367 | 9.5 | 9.617 | 9.719 | 9.805 | 9.875 | 9.93 | 9.969 | 9.992 | 10 | 9.992 | 9.969 | 9.93 | 9.875 | 9.805 | 9.719 | 9.617 | 9.5 | 9.367 | 9.219 | 9.055 | 8.875 | 8.68 | 8.469 | 8.242 | 8 |
| 0.9 | 8 | 8.242 | 8.469 | 8.68 | 8.875 | 9.055 | 9.219 | 9.367 | 9.5 | 9.617 | 9.719 | 9.805 | 9.875 | 9.93 | 9.969 | 9.992 | 10 | 9.992 | 9.969 | 9.93 | 9.875 | 9.805 | 9.719 | 9.617 | 9.5 | 9.367 | 9.219 | 9.055 | 8.875 | 8.68 | 8.469 | 8.242 | 8 |

FIG. 10

| | -1.6 | -1.5 | -1.4 | -1.3 | -1.2 | -1.1 | -1 | -0.9 | -0.8 | -0.7 | -0.6 | -0.5 | -0.4 | -0.3 | -0.2 | -0.1 | 0 | 0.1 | 0.2 | 0.3 | 0.4 | 0.5 | 0.6 | 0.7 | 0.8 | 0.9 | 1 | 1.1 | 1.2 | 1.3 | 1.4 | 1.5 | 1.6 |
|---|---|---|---|---|---|---|---|---|---|---|---|---|---|---|---|---|---|---|---|---|---|---|---|---|---|---|---|---|---|---|---|---|---|
| -0.9 | 8 | 8.196 | 8.39 | 8.581 | 8.765 | 8.943 | 9.111 | 9.269 | 9.414 | 9.546 | 9.663 | 9.764 | 9.848 | 9.914 | 9.962 | 9.99 | 10 | 9.99 | 9.962 | 9.914 | 9.848 | 9.764 | 9.663 | 9.546 | 9.414 | 9.269 | 9.111 | 8.943 | 8.765 | 8.581 | 8.39 | 8.196 | 8 |
| -0.8 | 8 | 8.196 | 8.39 | 8.581 | 8.765 | 8.943 | 9.111 | 9.269 | 9.414 | 9.546 | 9.663 | 9.764 | 9.848 | 9.914 | 9.962 | 9.99 | 10 | 9.99 | 9.962 | 9.914 | 9.848 | 9.764 | 9.663 | 9.546 | 9.414 | 9.269 | 9.111 | 8.943 | 8.765 | 8.581 | 8.39 | 8.196 | 8 |
| -0.7 | 8 | 8.196 | 8.39 | 8.581 | 8.765 | 8.943 | 9.111 | 9.269 | 9.414 | 9.546 | 9.663 | 9.764 | 9.848 | 9.914 | 9.962 | 9.99 | 10 | 9.99 | 9.962 | 9.914 | 9.848 | 9.764 | 9.663 | 9.546 | 9.414 | 9.269 | 9.111 | 8.943 | 8.765 | 8.581 | 8.39 | 8.196 | 8 |
| -0.6 | 8 | 8.196 | 8.39 | 8.581 | 8.765 | 8.943 | 9.111 | 9.269 | 9.414 | 9.546 | 9.663 | 9.764 | 9.848 | 9.914 | 9.962 | 9.99 | 10 | 9.99 | 9.962 | 9.914 | 9.848 | 9.764 | 9.663 | 9.546 | 9.414 | 9.269 | 9.111 | 8.943 | 8.765 | 8.581 | 8.39 | 8.196 | 8 |
| -0.5 | 8 | 8.196 | 8.39 | 8.581 | 8.765 | 8.943 | 9.111 | 9.269 | 9.414 | 9.546 | 9.663 | 9.764 | 9.848 | 9.914 | 9.962 | 9.99 | 10 | 9.99 | 9.962 | 9.914 | 9.848 | 9.764 | 9.663 | 9.546 | 9.414 | 9.269 | 9.111 | 8.943 | 8.765 | 8.581 | 8.39 | 8.196 | 8 |
| -0.4 | 8 | 8.196 | 8.39 | 8.581 | 8.765 | 8.943 | 9.111 | 9.269 | 9.414 | 9.546 | 9.663 | 9.764 | 9.848 | 9.914 | 9.962 | 9.99 | 10 | 9.99 | 9.962 | 9.914 | 9.848 | 9.764 | 9.663 | 9.546 | 9.414 | 9.269 | 9.111 | 8.943 | 8.765 | 8.581 | 8.39 | 8.196 | 8 |
| -0.3 | 8 | 8.196 | 8.39 | 8.581 | 8.765 | 8.943 | 9.111 | 9.269 | 9.414 | 9.546 | 9.663 | 9.764 | 9.848 | 9.914 | 9.962 | 9.99 | 10 | 9.99 | 9.962 | 9.914 | 9.848 | 9.764 | 9.663 | 9.546 | 9.414 | 9.269 | 9.111 | 8.943 | 8.765 | 8.581 | 8.39 | 8.196 | 8 |
| -0.2 | 8 | 8.196 | 8.39 | 8.581 | 8.765 | 8.943 | 9.111 | 9.269 | 9.414 | 9.546 | 9.663 | 9.764 | 9.848 | 9.914 | 9.962 | 9.99 | 10 | 9.99 | 9.962 | 9.914 | 9.848 | 9.764 | 9.663 | 9.546 | 9.414 | 9.269 | 9.111 | 8.943 | 8.765 | 8.581 | 8.39 | 8.196 | 8 |
| -0.1 | 8 | 8.196 | 8.39 | 8.581 | 8.765 | 8.943 | 9.111 | 9.269 | 9.414 | 9.546 | 9.663 | 9.764 | 9.848 | 9.914 | 9.962 | 9.99 | 10 | 9.99 | 9.962 | 9.914 | 9.848 | 9.764 | 9.663 | 9.546 | 9.414 | 9.269 | 9.111 | 8.943 | 8.765 | 8.581 | 8.39 | 8.196 | 8 |
| 0 | 8 | 8.196 | 8.39 | 8.581 | 8.765 | 8.943 | 9.111 | 9.269 | 9.414 | 9.546 | 9.663 | 9.764 | 9.848 | 9.914 | 9.962 | 9.99 | 10 | 9.99 | 9.962 | 9.914 | 9.848 | 9.764 | 9.663 | 9.546 | 9.414 | 9.269 | 9.111 | 8.943 | 8.765 | 8.581 | 8.39 | 8.196 | 8 |
| 0.1 | 8 | 8.196 | 8.39 | 8.581 | 8.765 | 8.943 | 9.111 | 9.269 | 9.414 | 9.546 | 9.663 | 9.764 | 9.848 | 9.914 | 9.962 | 9.99 | 10 | 9.99 | 9.962 | 9.914 | 9.848 | 9.764 | 9.663 | 9.546 | 9.414 | 9.269 | 9.111 | 8.943 | 8.765 | 8.581 | 8.39 | 8.196 | 8 |
| 0.2 | 8 | 8.196 | 8.39 | 8.581 | 8.765 | 8.943 | 9.111 | 9.269 | 9.414 | 9.546 | 9.663 | 9.764 | 9.848 | 9.914 | 9.962 | 9.99 | 10 | 9.99 | 9.962 | 9.914 | 9.848 | 9.764 | 9.663 | 9.546 | 9.414 | 9.269 | 9.111 | 8.943 | 8.765 | 8.581 | 8.39 | 8.196 | 8 |
| 0.3 | 8 | 8.196 | 8.39 | 8.581 | 8.765 | 8.943 | 9.111 | 9.269 | 9.414 | 9.546 | 9.663 | 9.764 | 9.848 | 9.914 | 9.962 | 9.99 | 10 | 9.99 | 9.962 | 9.914 | 9.848 | 9.764 | 9.663 | 9.546 | 9.414 | 9.269 | 9.111 | 8.943 | 8.765 | 8.581 | 8.39 | 8.196 | 8 |
| 0.4 | 8 | 8.196 | 8.39 | 8.581 | 8.765 | 8.943 | 9.111 | 9.269 | 9.414 | 9.546 | 9.663 | 9.764 | 9.848 | 9.914 | 9.962 | 9.99 | 10 | 9.99 | 9.962 | 9.914 | 9.848 | 9.764 | 9.663 | 9.546 | 9.414 | 9.269 | 9.111 | 8.943 | 8.765 | 8.581 | 8.39 | 8.196 | 8 |
| 0.5 | 8 | 8.196 | 8.39 | 8.581 | 8.765 | 8.943 | 9.111 | 9.269 | 9.414 | 9.546 | 9.663 | 9.764 | 9.848 | 9.914 | 9.962 | 9.99 | 10 | 9.99 | 9.962 | 9.914 | 9.848 | 9.764 | 9.663 | 9.546 | 9.414 | 9.269 | 9.111 | 8.943 | 8.765 | 8.581 | 8.39 | 8.196 | 8 |
| 0.6 | 8 | 8.196 | 8.39 | 8.581 | 8.765 | 8.943 | 9.111 | 9.269 | 9.414 | 9.546 | 9.663 | 9.764 | 9.848 | 9.914 | 9.962 | 9.99 | 10 | 9.99 | 9.962 | 9.914 | 9.848 | 9.764 | 9.663 | 9.546 | 9.414 | 9.269 | 9.111 | 8.943 | 8.765 | 8.581 | 8.39 | 8.196 | 8 |
| 0.7 | 8 | 8.196 | 8.39 | 8.581 | 8.765 | 8.943 | 9.111 | 9.269 | 9.414 | 9.546 | 9.663 | 9.764 | 9.848 | 9.914 | 9.962 | 9.99 | 10 | 9.99 | 9.962 | 9.914 | 9.848 | 9.764 | 9.663 | 9.546 | 9.414 | 9.269 | 9.111 | 8.943 | 8.765 | 8.581 | 8.39 | 8.196 | 8 |
| 0.8 | 8 | 8.196 | 8.39 | 8.581 | 8.765 | 8.943 | 9.111 | 9.269 | 9.414 | 9.546 | 9.663 | 9.764 | 9.848 | 9.914 | 9.962 | 9.99 | 10 | 9.99 | 9.962 | 9.914 | 9.848 | 9.764 | 9.663 | 9.546 | 9.414 | 9.269 | 9.111 | 8.943 | 8.765 | 8.581 | 8.39 | 8.196 | 8 |
| 0.9 | 8 | 8.196 | 8.39 | 8.581 | 8.765 | 8.943 | 9.111 | 9.269 | 9.414 | 9.546 | 9.663 | 9.764 | 9.848 | 9.914 | 9.962 | 9.99 | 10 | 9.99 | 9.962 | 9.914 | 9.848 | 9.764 | 9.663 | 9.546 | 9.414 | 9.269 | 9.111 | 8.943 | 8.765 | 8.581 | 8.39 | 8.196 | 8 |

FIG. 12

| | -1.6 | -1.5 | -1.4 | -1.3 | -1.2 | -1.1 | -1 | -0.9 | -0.8 | -0.7 | -0.6 | -0.5 | -0.4 | -0.3 | -0.2 | -0.1 | 0 | 0.1 | 0.2 | 0.3 | 0.4 | 0.5 | 0.6 | 0.7 | 0.8 | 0.9 | 1 | 1.1 | 1.2 | 1.3 | 1.4 | 1.5 | 1.6 |
|---|---|---|---|---|---|---|---|---|---|---|---|---|---|---|---|---|---|---|---|---|---|---|---|---|---|---|---|---|---|---|---|---|---|
| -0.9 | 8 | 8.234 | 8.438 | 8.609 | 8.75 | 8.859 | 8.938 | 8.984 | 9 | 9 | 9 | 9 | 9 | 9 | 9 | 9 | 9 | 9 | 9 | 9 | 9 | 9 | 9 | 9 | 9 | 8.984 | 8.938 | 8.859 | 8.75 | 8.609 | 8.438 | 8.234 | 8 |
| -0.8 | 8.395 | 8.629 | 8.833 | 9.004 | 9.145 | 9.254 | 9.333 | 9.379 | 9.395 | 9.395 | 9.395 | 9.395 | 9.395 | 9.395 | 9.395 | 9.395 | 9.395 | 9.395 | 9.395 | 9.395 | 9.395 | 9.395 | 9.395 | 9.395 | 9.395 | 9.379 | 9.333 | 9.254 | 9.145 | 9.004 | 8.833 | 8.629 | 8.395 |
| -0.7 | 8.691 | 8.926 | 9.129 | 9.301 | 9.441 | 9.551 | 9.629 | 9.676 | 9.691 | 9.691 | 9.691 | 9.691 | 9.691 | 9.691 | 9.691 | 9.691 | 9.691 | 9.691 | 9.691 | 9.691 | 9.691 | 9.691 | 9.691 | 9.691 | 9.691 | 9.676 | 9.629 | 9.551 | 9.441 | 9.301 | 9.129 | 8.926 | 8.691 |
| -0.6 | 8.889 | 9.123 | 9.326 | 9.498 | 9.639 | 9.748 | 9.826 | 9.873 | 9.889 | 9.889 | 9.889 | 9.889 | 9.889 | 9.889 | 9.889 | 9.889 | 9.889 | 9.889 | 9.889 | 9.889 | 9.889 | 9.889 | 9.889 | 9.889 | 9.889 | 9.873 | 9.826 | 9.748 | 9.639 | 9.498 | 9.326 | 9.123 | 8.889 |
| -0.5 | 8.988 | 9.222 | 9.425 | 9.597 | 9.738 | 9.847 | 9.925 | 9.972 | 9.988 | 9.988 | 9.988 | 9.988 | 9.988 | 9.988 | 9.988 | 9.988 | 9.988 | 9.988 | 9.988 | 9.988 | 9.988 | 9.988 | 9.988 | 9.988 | 9.988 | 9.972 | 9.925 | 9.847 | 9.738 | 9.597 | 9.425 | 9.222 | 8.988 |
| -0.4 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| -0.3 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| -0.2 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| -0.1 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| 0 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| 0.1 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| 0.2 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| 0.3 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| 0.4 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| 0.5 | 8.988 | 9.222 | 9.425 | 9.597 | 9.738 | 9.847 | 9.925 | 9.972 | 9.988 | 9.988 | 9.988 | 9.988 | 9.988 | 9.988 | 9.988 | 9.988 | 9.988 | 9.988 | 9.988 | 9.988 | 9.988 | 9.988 | 9.988 | 9.988 | 9.988 | 9.972 | 9.925 | 9.847 | 9.738 | 9.597 | 9.425 | 9.222 | 8.988 |
| 0.6 | 8.889 | 9.123 | 9.326 | 9.498 | 9.639 | 9.748 | 9.826 | 9.873 | 9.889 | 9.889 | 9.889 | 9.889 | 9.889 | 9.889 | 9.889 | 9.889 | 9.889 | 9.889 | 9.889 | 9.889 | 9.889 | 9.889 | 9.889 | 9.889 | 9.889 | 9.873 | 9.826 | 9.748 | 9.639 | 9.498 | 9.326 | 9.123 | 8.889 |
| 0.7 | 8.691 | 8.926 | 9.129 | 9.301 | 9.441 | 9.551 | 9.629 | 9.676 | 9.691 | 9.691 | 9.691 | 9.691 | 9.691 | 9.691 | 9.691 | 9.691 | 9.691 | 9.691 | 9.691 | 9.691 | 9.691 | 9.691 | 9.691 | 9.691 | 9.691 | 9.676 | 9.629 | 9.551 | 9.441 | 9.301 | 9.129 | 8.926 | 8.691 |
| 0.8 | 8.395 | 8.629 | 8.833 | 9.004 | 9.145 | 9.254 | 9.333 | 9.379 | 9.395 | 9.395 | 9.395 | 9.395 | 9.395 | 9.395 | 9.395 | 9.395 | 9.395 | 9.395 | 9.395 | 9.395 | 9.395 | 9.395 | 9.395 | 9.395 | 9.395 | 9.379 | 9.333 | 9.254 | 9.145 | 9.004 | 8.833 | 8.629 | 8.395 |
| 0.9 | 8 | 8.234 | 8.438 | 8.609 | 8.75 | 8.859 | 8.938 | 8.984 | 9 | 9 | 9 | 9 | 9 | 9 | 9 | 9 | 9 | 9 | 9 | 9 | 9 | 9 | 9 | 9 | 9 | 8.984 | 8.938 | 8.859 | 8.75 | 8.609 | 8.438 | 8.234 | 8 |

FIG. 13

| | -1.6 | -1.5 | -1.4 | -1.3 | -1.2 | -1.1 | -1 | -0.9 | -0.8 | -0.7 | -0.6 | -0.5 | -0.4 | -0.3 | -0.2 | -0.1 | 0 | 0.1 | 0.2 | 0.3 | 0.4 | 0.5 | 0.6 | 0.7 | 0.8 | 0.9 | 1 | 1.1 | 1.2 | 1.3 | 1.4 | 1.5 | 1.6 |
|---|---|---|---|---|---|---|---|---|---|---|---|---|---|---|---|---|---|---|---|---|---|---|---|---|---|---|---|---|---|---|---|---|---|
| -0.9 | 8 | 8.195 | 8.383 | 8.556 | 8.707 | 8.831 | 8.924 | 8.981 | 9 | 9 | 9 | 9 | 9 | 9 | 9 | 9 | 9 | 9 | 9 | 9 | 9 | 9 | 9 | 9 | 9 | 8.981 | 8.924 | 8.831 | 8.707 | 8.556 | 8.383 | 8.195 | 8 |
| -0.8 | 8.342 | 8.537 | 8.725 | 8.898 | 9.049 | 9.173 | 9.266 | 9.323 | 9.342 | 9.342 | 9.342 | 9.342 | 9.342 | 9.342 | 9.342 | 9.342 | 9.342 | 9.342 | 9.342 | 9.342 | 9.342 | 9.342 | 9.342 | 9.342 | 9.342 | 9.323 | 9.266 | 9.173 | 9.049 | 8.898 | 8.725 | 8.537 | 8.342 |
| -0.7 | 8.643 | 8.838 | 9.025 | 9.198 | 9.35 | 9.474 | 9.567 | 9.624 | 9.643 | 9.643 | 9.643 | 9.643 | 9.643 | 9.643 | 9.643 | 9.643 | 9.643 | 9.643 | 9.643 | 9.643 | 9.643 | 9.643 | 9.643 | 9.643 | 9.643 | 9.624 | 9.567 | 9.474 | 9.35 | 9.198 | 9.025 | 8.838 | 8.643 |
| -0.6 | 8.866 | 9.061 | 9.249 | 9.422 | 9.573 | 9.697 | 9.79 | 9.847 | 9.866 | 9.866 | 9.866 | 9.866 | 9.866 | 9.866 | 9.866 | 9.866 | 9.866 | 9.866 | 9.866 | 9.866 | 9.866 | 9.866 | 9.866 | 9.866 | 9.866 | 9.847 | 9.79 | 9.697 | 9.573 | 9.422 | 9.249 | 9.061 | 8.866 |
| -0.5 | 8.985 | 9.18 | 9.367 | 9.54 | 9.692 | 9.816 | 9.909 | 9.966 | 9.985 | 9.985 | 9.985 | 9.985 | 9.985 | 9.985 | 9.985 | 9.985 | 9.985 | 9.985 | 9.985 | 9.985 | 9.985 | 9.985 | 9.985 | 9.985 | 9.985 | 9.966 | 9.909 | 9.816 | 9.692 | 9.54 | 9.367 | 9.18 | 8.985 |
| -0.4 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| -0.3 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| -0.2 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| -0.1 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| 0 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| 0.1 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| 0.2 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| 0.3 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| 0.4 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| 0.5 | 8.985 | 9.18 | 9.367 | 9.54 | 9.692 | 9.816 | 9.909 | 9.966 | 9.985 | 9.985 | 9.985 | 9.985 | 9.985 | 9.985 | 9.985 | 9.985 | 9.985 | 9.985 | 9.985 | 9.985 | 9.985 | 9.985 | 9.985 | 9.985 | 9.985 | 9.966 | 9.909 | 9.816 | 9.692 | 9.54 | 9.367 | 9.18 | 8.985 |
| 0.6 | 8.866 | 9.061 | 9.249 | 9.422 | 9.573 | 9.697 | 9.79 | 9.847 | 9.866 | 9.866 | 9.866 | 9.866 | 9.866 | 9.866 | 9.866 | 9.866 | 9.866 | 9.866 | 9.866 | 9.866 | 9.866 | 9.866 | 9.866 | 9.866 | 9.866 | 9.847 | 9.79 | 9.697 | 9.573 | 9.422 | 9.249 | 9.061 | 8.866 |
| 0.7 | 8.643 | 8.838 | 9.025 | 9.198 | 9.35 | 9.474 | 9.567 | 9.624 | 9.643 | 9.643 | 9.643 | 9.643 | 9.643 | 9.643 | 9.643 | 9.643 | 9.643 | 9.643 | 9.643 | 9.643 | 9.643 | 9.643 | 9.643 | 9.643 | 9.643 | 9.624 | 9.567 | 9.474 | 9.35 | 9.198 | 9.025 | 8.838 | 8.643 |
| 0.8 | 8.342 | 8.537 | 8.725 | 8.898 | 9.049 | 9.173 | 9.266 | 9.323 | 9.342 | 9.342 | 9.342 | 9.342 | 9.342 | 9.342 | 9.342 | 9.342 | 9.342 | 9.342 | 9.342 | 9.342 | 9.342 | 9.342 | 9.342 | 9.342 | 9.342 | 9.323 | 9.266 | 9.173 | 9.049 | 8.898 | 8.725 | 8.537 | 8.342 |
| 0.9 | 8 | 8.195 | 8.383 | 8.556 | 8.707 | 8.831 | 8.924 | 8.981 | 9 | 9 | 9 | 9 | 9 | 9 | 9 | 9 | 9 | 9 | 9 | 9 | 9 | 9 | 9 | 9 | 9 | 8.981 | 8.924 | 8.831 | 8.707 | 8.556 | 8.383 | 8.195 | 8 |

FIG. 15

| | -1.6 | -1.5 | -1.4 | -1.3 | -1.2 | -1.1 | -1 | -0.9 | -0.8 | -0.7 | -0.6 | -0.5 | -0.4 | -0.3 | -0.2 | -0.1 | 0 | 0.1 | 0.2 | 0.3 | 0.4 | 0.5 | 0.6 | 0.7 | 0.8 | 0.9 | 1 | 1.1 | 1.2 | 1.3 | 1.4 | 1.5 | 1.6 |
|---|---|---|---|---|---|---|---|---|---|---|---|---|---|---|---|---|---|---|---|---|---|---|---|---|---|---|---|---|---|---|---|---|---|
| -0.9 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| -0.8 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| -0.7 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| -0.6 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| -0.5 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| -0.4 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| -0.3 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| -0.2 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| -0.1 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| 0 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| 0.1 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| 0.2 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| 0.3 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| 0.4 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| 0.5 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| 0.6 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| 0.7 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| 0.8 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |
| 0.9 | 9 | 9.234 | 9.438 | 9.609 | 9.75 | 9.859 | 9.938 | 9.984 | 10 | 10 | 10 | 10 | 10 | 10 | 10 | 10 | 10 | 10 | 10 | 10 | 10 | 10 | 10 | 10 | 10 | 9.984 | 9.938 | 9.859 | 9.75 | 9.609 | 9.438 | 9.234 | 9 |

FIG. 16

| | -1.6 | -1.5 | -1.4 | -1.3 | -1.2 | -1.1 | -1 | -0.9 | -0.8 | -0.7 | -0.6 | -0.5 | -0.4 | -0.3 | -0.2 | -0.1 | 0 | 0.1 | 0.2 | 0.3 | 0.4 | 0.5 | 0.6 | 0.7 | 0.8 | 0.9 | 1 | 1.1 | 1.2 | 1.3 | 1.4 | 1.5 | 1.6 |
|---|---|---|---|---|---|---|---|---|---|---|---|---|---|---|---|---|---|---|---|---|---|---|---|---|---|---|---|---|---|---|---|---|---|
| -0.9 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| -0.8 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| -0.7 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| -0.6 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| -0.5 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| -0.4 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| -0.3 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| -0.2 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| -0.1 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| 0 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| 0.1 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| 0.2 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| 0.3 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| 0.4 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| 0.5 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| 0.6 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| 0.7 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| 0.8 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |
| 0.9 | 9 | 9.195 | 9.383 | 9.556 | 9.707 | 9.831 | 9.924 | 9.981 | 10 | 10 | 10 | 10 | 10 | 10 | 10 | 10 | 10 | 10 | 10 | 10 | 10 | 10 | 10 | 10 | 10 | 9.981 | 9.924 | 9.831 | 9.707 | 9.556 | 9.383 | 9.195 | 9 |

FIG. 20

| LOOKUP TABLE | REPRESENTATIVE INPUT VALUE (SAME-INTERVAL DIVISION EXAMPLE) |
|---|---|
| TB0 | 0 |
| TB1 | 64 |
| TB2 | 128 |
| TB3 | 192 |
| TB4 | 256 |
| TB5 | 320 |
| TB6 | 384 |
| TB7 | 448 |
| TB8 | 512 |
| TB9 | 576 |
| TB10 | 640 |
| TB11 | 704 |
| TB12 | 768 |
| TB13 | 832 |
| TB14 | 896 |
| TB15 | 960 |
| TB16 | 1023 |

METHOD OF CALCULATING CORRECTION VALUE AND DISPLAY DEVICE

BACKGROUND OF THE INVENTION

1. Field of the Invention

The present invention relates to a display device and a method of calculating a correction value for correcting an image signal supplied to a display panel in a display device.

2. Description of the Related Art

As can be seen from Japanese Unexamined Patent Application Publication No. 2005-195832, for the purpose of correcting unevenness of luminance and chromaticity of a display device (or simply a display panel) so as to improve uniformity, an unevenness correcting device for determining a correction value by a coordinate of an X direction, a Y direction and a grayscale direction (Z direction) of a panel, which is called 3D-γ system, has been put to practical use.

The unevenness correcting device is mounted in an image display device such as a television device as a circuit unit for performing a correcting process with respect to an image signal supplied to a display panel unit.

FIG. 24 shows an example of signal correction using an unevenness correcting circuit. This is a 2D map diagram of a luminance-corrected image to be output when a uniform luminance image is input to a display panel.

For example, it is assumed that an image signal value (grayscale value) is represented by 10 bits and grayscale has 1024 steps of 0 to 1023. If image signals having a grayscale value of "512" are given to an overall screen, that is, all pixels constituting a screen, the overall screen should display a uniform image having a grayscale value of "512". However, due to luminance unevenness of the display panel, a darker portion or a brighter portion than the portion having the grayscale value of 512 is generated on the screen. Thus, the uniformity of the screen is low. In order to improve this, the image signal values given to the pixels are corrected according to the characteristics of the luminance unevenness.

That is, a signal for the portion of a low-luminance on an unadjusted panel is converted to an image signal having a high-luminance value, a signal for the portion of a high-luminance on the unadjusted panel is converted to an image signal having a low-luminance value, and these signals are given to the display panel as the corrected image signals, thereby outputting a desired image having uniform luminance.

For example, an image signal value corrected to have a grayscale value higher than "512" is given to a pixel of a darker portion than "512", even when the grayscale value "512" is given, on the screen depending on a luminance difference.

In addition, an image signal value corrected to have a grayscale value lower than "512" is given to a pixel of a brighter portion than "512", even when the grayscale value "512" is given, on the screen depending on a luminance difference.

FIG. 24 shows grayscale values as the correction values on an XY plane corresponding to a screen plane and shows corrected grayscale values by the shades of the pixels. By such correction, it is possible to prevent deterioration of uniformity due to luminance unevenness characteristics of the display panel and to display an image with a high quality.

In an unevenness correcting circuit of a 3D-γ system, such a 2D map is prepared for a uniform image having a variety of luminance values.

FIG. 25 shows an input/output function of panel luminance correction by making a graph of the Z direction (grayscale direction) of the 3D-γ system.

If the panel is completely uniform, a linear graph representing the output of an input signal without modification is obtained. However, the graph of FIG. 25 shows that the actual input/output function has variations in order to correct the uniformity on a pixel-by-pixel basis.

For example, in a grayscale value Ain of an input side (horizontal axis), an output side (vertical axis) as a corrected grayscale value is in a range from Aout1 to Aout2. When an image signal with the grayscale value Ain is given to all pixels such that a uniform image is displayed, the grayscale value is necessary to be corrected for each pixel in order to actually display the uniform image. As a result, the correction value of each pixel is in a range from Aout1 to Aout2.

The range of the correction value is different for each grayscale value. Due to the variation of each grayscale value, the 2D map is necessary to be prepared for each grayscale value.

The unevenness correcting circuit includes a lookup table unit 100 and a correction operation circuit 101 as shown in FIG. 26.

In the lookup table unit 100, a lookup table as the 2D map is stored for each grayscale value. In each lookup table, with respect to input grayscale values, a grayscale value (or a coefficient for obtaining a corrected grayscale value) as a correction value is stored for each pixel.

The correction operation circuit 101 reads values necessary for an operation from the lookup table unit 100, and computes and outputs image signal values for correcting luminance unevenness and chromaticity unevenness of a panel using the values, with respect to input original image signal values.

In order to retain unevenness correction data with respect to all the X direction, the Y direction and the Z direction, the amount of data may be impractically enormous. Therefore, a method of storing correction values with the 2D maps for the representative Z coordinate (grayscale value) and estimating and using correction values from the representative correction values in the other coordinates is generally applied.

For example, although the grayscale values of the 1024 steps of "0" to "1023" are considered as the grayscale value (Z direction) in FIG. 25, it is not practical that a 3D-γ system is established by retaining 1024 2D maps (lookup tables).

Therefore, of the values from "0" to "1023", n representative input values obtained by sampling several correction values, such as "0", "64", "128", . . . , and "1023", in the Z direction are set and n lookup tables for the n representative input values are retained.

If the input image signal value is a grayscale value which is not sampled, an interpolation operation is performed using correction values stored in the lookup tables of the grayscale values that are larger and smaller, respectively, than the input image signal value and closest to this input image signal value. For example, correction values are obtained by a linear interpolation operation.

In such a correction system, how the correction values of the pixels are determined will be described.

In FIG. 27A, a horizontal axis denotes a position X of any horizontal line of an uncorrected panel and a vertical axis denotes the luminance of the position. Panel luminance LP when a certain grayscale value V is input is denoted by a solid line. It can be seen that the panel luminance is not uniform due to unevenness. In addition, panel luminance LP is luminance which actually appears on the panel when one grayscale value V is given to all the pixels of the panel.

In addition, there is a tendency that the luminance of the central portion of the panel is highest.

In order to calculate a correction value for correcting an input image signal with respect to a panel with unevenness, in an existing method, target luminance values of all pixels are set to target luminance TG denoted by a dotted line in FIG. 27A.

That is, if a grayscale value V is given and the pixels emit light with luminance Lt, originally, the luminance of the overall screen uniformly becomes luminance Lt. With respect to the overall screen (all pixels), the target luminance becomes TG=Lt.

Next, correction values for the pixels are obtained such that all the pixels have a target luminance value (luminance Lt).

In FIG. 27B, a horizontal axis denotes grayscale V and a vertical axis denotes luminance L. An ideal V-L curve has target luminance Lt when the grayscale is V.

Meanwhile, a V-L curve before correcting the luminance of a certain pixel to be corrected is positioned below the ideal V-L curve, as shown in FIG. 27B. Then, in order to output the target luminance Lt, (V+ΔV) is necessary as a grayscale value given to the pixel.

That is, it can be seen that (V+ΔV) is necessary to be output when V is input to the unevenness correcting circuit.

As shown in FIG. 28A, a graph made by obtaining all the correction values (V+ΔV) satisfying such a condition in the X direction of the panel is denoted by a solid line H indicating the correction values. As the characteristics of the elements of the panel, a small correction value is obtained at a position having a high luminance and a large correction value is obtained at a position having a low luminance.

In addition, the unevenness correcting circuit is necessary to satisfy the above-described function with respect to all input grayscale.

SUMMARY OF THE INVENTION

If the correction values are calculated and the image signal values given to the pixels of the display panel are corrected as described above, there is no difficulty when the image signal values are in a range of low luminance or intermediate luminance, but a problem that correction may not be performed occurs in a range of high luminance.

That is, in an actual circuit, since the correction value (V+ΔV) is not set beyond the grayscale value of 1023 (the grayscale of 10 bits), for example, as shown in FIG. 28B, correction is not effective in an area in which the correction value (V+ΔV) exceeds the grayscale value of 1023.

FIGS. 29A to 29F show areas with low luminance, intermediate luminance and high luminance.

FIGS. 29A and 29B show the luminance L1 of a certain low-luminance area. FIG. 29A shows panel luminance LP1 and target luminance TG1 corresponding to the luminance L1. In this case, the correction value is denoted by a solid line H1 in FIG. 29B.

FIGS. 29C and 29D show the luminance L2 of a certain intermediate-luminance area. FIG. 29C shows panel luminance LP2 and target luminance TG2 corresponding to the luminance L2. In this case, the correction value is denoted by a solid line H2 in FIG. 29D.

With respect to the low-luminance area and the intermediate-luminance area, as denoted by the solid lines H1 and H2, since the correction value (V+ΔV) does not exceed the grayscale value of 1023, it is possible to perform correction in any position of the panel.

Meanwhile, FIGS. 29E and 29F show the luminance L3 of a certain high-luminance area. FIG. 29E shows panel luminance LP3 and target luminance TG3 corresponding to the luminance L3. In this case, the correction value is denoted by a solid line H3 in FIG. 29F.

In this case, a portion in which the correction value (V+ΔV) exceeds the grayscale value of 1023 occurs, and correction may not be performed in a portion of the panel corresponding thereto.

Description has been heretofore made with respect to the cross section in the X direction of the panel. FIG. 30 shows above-described conditions in a two-dimensional direction (XY direction) of the panel.

For example, if the correction value (V+ΔV) exceeds the grayscale value of 1023 at the left and right end sides of the panel in the X direction and the correction value (V+ΔV) exceeds the grayscale value of 1023 at the upper and lower end sides of the panel in the Y direction, only the luminance values of pixels in the central portion of the panel can be corrected and those in the peripheral portion thereof may not be corrected as shown in FIG. 30.

In order to prevent an uncorrectable area from occurring, for example, the target luminance is necessary to be lowered. For example, by shifting the line of the target luminance TG3 in FIG. 29E to the low luminance side, all the correction values of the solid line H3 in FIG. 29F are equal to or less than the grayscale value of 1023.

However, in this case, as a manner of course, the luminance after correction is lowered and thus a satisfactory display image may not be obtained.

It is desirable to appropriately perform correction in an overall screen including a high-luminance area, without decreasing luminance after correction.

According to an embodiment of the present invention, there is provided a method of calculating a correction value used when signal value correction is performed with respect to an image signal supplied to a display panel. The method includes the steps of setting a target luminance value, which is not uniform in an overall surface of the display panel, as a target luminance value of one image signal value such that at least a portion of a distribution of target luminance values at each plane position of the display panel becomes a curved distribution, and calculating a correction value at each plane position of the display panel using luminance observed at each plane position of the display panel when one image signal value is given to the overall surface of the display panel and the target luminance value at each plane position of the display panel.

Each of a plurality of representative values selected from minimum grayscale value to maximum grayscale value of the display panel may become one image signal value, and the correction value at each plane position of the display panel may be calculated corresponding to the image signal value as each of the representative values.

The target luminance value of one image signal value at each plane position of the display panel may be set so as to be distributed in a range which does not exceed a maximum luminance value observed when one image signal is given to the overall surface of the display panel.

The distribution of the target luminance value of one image signal value at each plane position of the display panel may become a curved distribution in which four corner portions of the panel have a low luminance value, as compared with the center portion of the panel.

The distribution of the target luminance value of one image signal value at each plane position of the display panel may become a curved distribution in which left and right portions of the panel have a low luminance value, as compared with the center portion of the panel.

The distribution of the target luminance value of one image signal value at each plane position of the display panel may have a uniform distribution area, in which the target luminance value is uniform, in a central portion of the panel, and may have a curved distribution in a portion other than the central portion of the panel.

The distribution of the target luminance value of one image signal value at each plane position of the display panel may be set so as to become a curved distribution represented by a curve obtained by reducing a frequency of a curve of a variation in luminance value at each plane position of the display panel observed when one image signal value is given to the overall surface of the display panel.

The target luminance value of one image signal value at each plane position of the display panel may be set in a range in which an image signal value after the correction using the correction value does not exceed a maximum grayscale value of the display panel.

According to another embodiment of the present invention, there is provided a display device including a display unit which performs an image display on a display panel by a supplied image signal, a memory table unit having a plurality of reference tables respectively corresponding to a plurality of representative values as an image signal value, the reference tables each storing a correction value at each plane position of the display panel in advance, and a correction operation unit which calculates a corrected image signal value as the image signal supplied to the display panel by an operation using an input image signal value and the correction value read from a reference table corresponding to the input image signal value in the memory table unit. The correction value stored in each of the reference tables is calculated at each plane position of the display panel using luminance observed at each plane position of the display panel when one image signal value is given to an overall surface of the display panel and a target luminance value to each plane position of the display panel after a target luminance value which is not uniform in the overall surface of the display panel is set as a target luminance value of one image signal value such that at least a portion of a distribution of the target luminance value at each plane position of the display panel becomes a curved distribution.

The embodiments of the present invention relate to a 3D-γ system in which uniformity is improved by correcting luminance unevenness or chromaticity unevenness of a display panel and a correction value is determined by a coordinate in an X direction, a Y direction and a grayscale direction (Z direction) of the panel.

In the display device, the correction value is stored in the memory table unit. With respect to the input image signal, the correction of the image signal value is performed by reading the correction value according to the luminance level and the horizontal position of the display panel from the memory table unit.

In the embodiments of the present invention, overall luminance is not lowered, but the correction is suitably performed in any luminance area. In particular, in a high-luminance area, the target luminance of each pixel which is close to the panel characteristics at the time of non-correction but allows unevenness to be inconspicuous is set. That is, a target luminance value which is not uniform in the overall surface of the display panel is set as a target luminance value of one image signal value such that a portion or all of the distribution of the target luminance value at each plane position of the display panel becomes a curved distribution. The correction value at each plane position of the display panel is calculated corresponding to a difference between the target luminance value and luminance observed at each plane position of the display panel when one image signal value is actually given to the overall surface of the display panel.

According to the embodiments of the present invention, in a display device having a 3D-γ unevenness correction system mounted therein, in particular, an uncorrectable area in a high-luminance area can be eliminated and thus unevenness can be suitably corrected without deteriorating luminance.

BRIEF DESCRIPTION OF THE DRAWINGS

FIG. 6 is a diagram illustrating an example of setting target luminance according to an embodiment of the present invention;

FIG. 7 is a diagram illustrating an example of setting target luminance according to an embodiment of the present invention;

FIG. 9 is a diagram illustrating an example of setting target luminance according to an embodiment of the present invention;

FIG. 10 is a diagram illustrating an example of setting target luminance according to an embodiment of the present invention;

FIG. 12 is a diagram illustrating an example of setting target luminance according to an embodiment of the present invention;

FIG. 13 is a diagram illustrating an example of setting target luminance according to an embodiment of the present invention;

FIG. 15 is a diagram illustrating an example of setting target luminance according to an embodiment of the present invention;

FIG. 16 is a diagram illustrating an example of setting target luminance according to an embodiment of the present invention;

FIG. 20 is a diagram illustrating the representative input value of a lookup table according to an embodiment of the present invention;

DESCRIPTION OF THE PREFERRED EMBODIMENTS

Hereinafter, embodiments of the present invention will be described in the following order.

[1. Target Setting and Correction Value Calculation of Embodiment]

[2. Detailed Example of Target Setting]

[3. Display device of Embodiment]

1. Target Setting and Correction Value Calculation of Embodiment

Target setting and correction value calculation of an embodiment will be described with reference to FIGS. 1 to 5.

Figure 1:
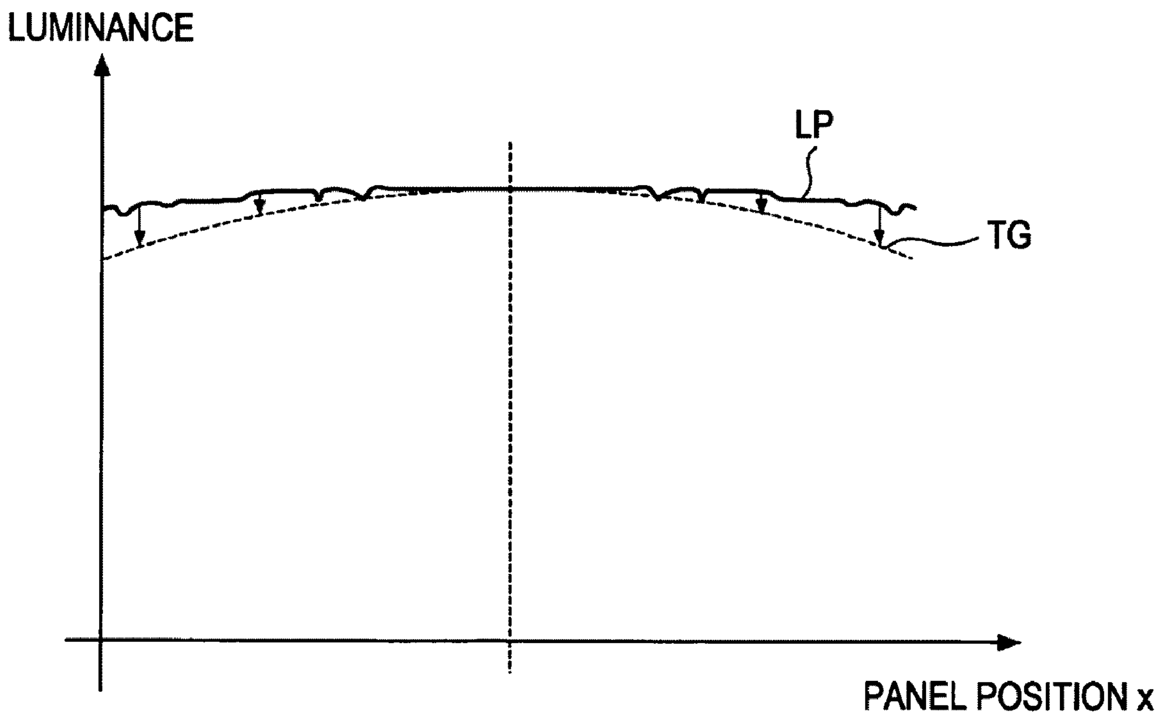
FIG. 1 is a diagram illustrating distribution of target luminance values for calculating a correction value according to an embodiment of the present invention.

First, FIG. 1 shows target luminance for correction value calculation.

In FIG. 1, a horizontal axis denotes the position X of any horizontal line of an uncorrected panel and a vertical axis denotes the luminance of that position.

Panel luminance LP when a certain grayscale value V is input is denoted by a solid line. The panel luminance LP is luminance which actually appears on the panel when one grayscale value V is given to all pixels of the panel, but is not uniform due to unevenness of the display panel. For example, the luminance of the central portion of the panel is highest.

When correction values for correcting input image signals are calculated with respect to a panel with unevenness, in the past, in order to make luminance unevenness uniform, target luminance having a linear distribution, that is target luminance which is uniform regardless of a horizontal position of the panel, was set.

In contrast, in the present example, for example, as denoted by a dotted line of FIG. 1, target luminance TG having a parabolically curved distribution, in which a peak is placed on the central portion of the panel, is set.

For example, by setting target luminance TG as the distribution denoted by the dotted line of FIG. 1, it is possible appropriately to perform correction even in any one of a low-luminance area, an intermediate-luminance area and a high-luminance area.

Figure 27A:
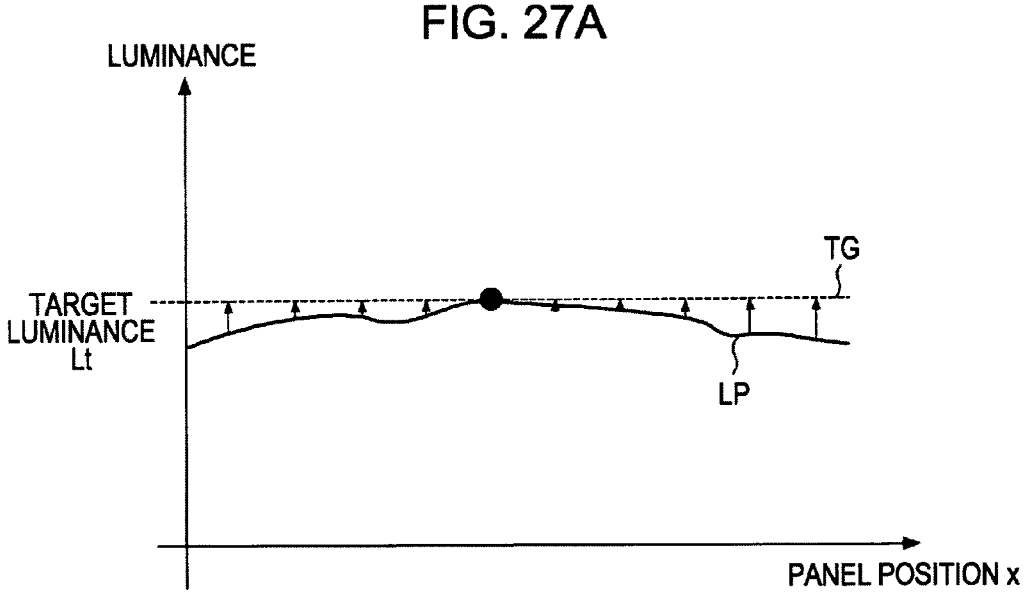
FIGS. 27A and 27B are diagrams illustrating calculation of a target luminance value and a correction value in the related art.
Figure 27B:
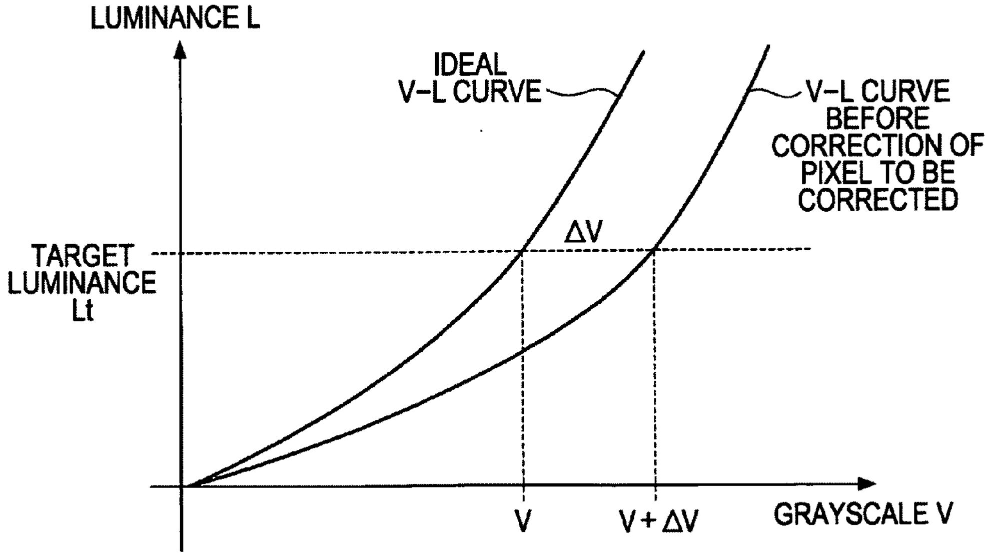

As described with respect to FIG. 27B, in the grayscale value as the correction value, ΔV corresponding to a difference between actual luminance and target luminance when a certain grayscale V is given to a certain pixel is obtained. In addition, (V+ΔV) becomes the correction value.

Figure 2A:
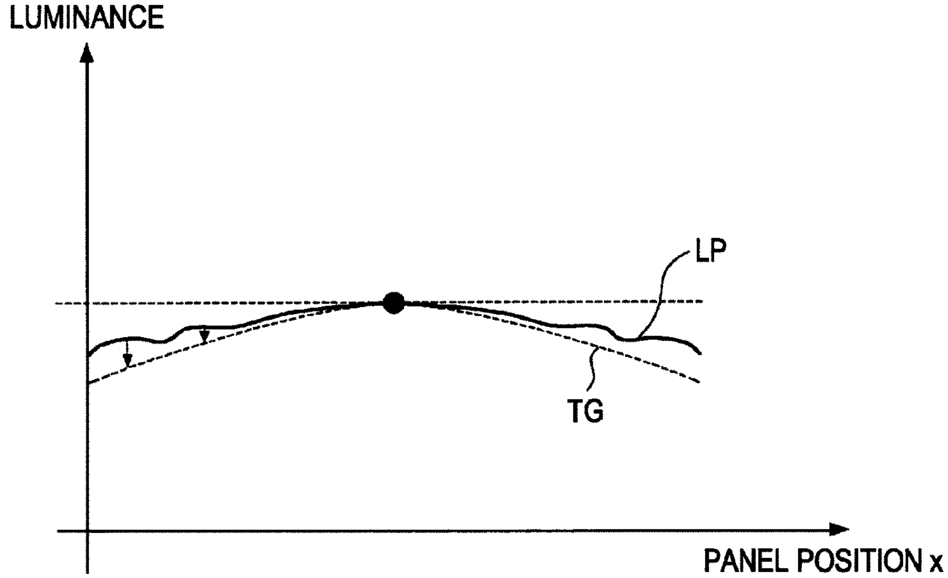
FIGS. 2A and 2B are diagrams illustrating correction value calculation according to an embodiment of the invention.
Figure 2B:
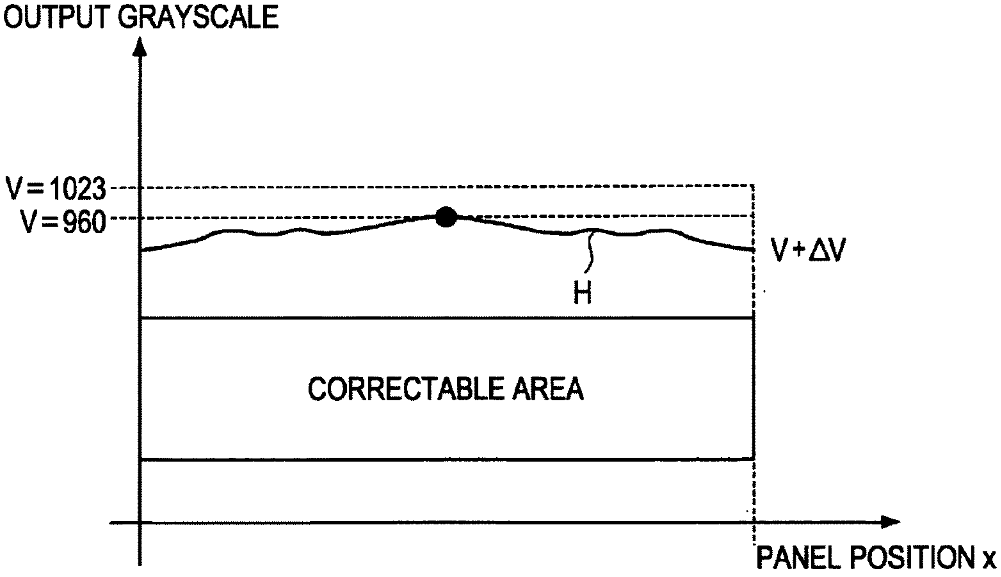

By applying it to the present example, for example, FIGS. 2A and 2B are obtained.

As denoted by a dotted line of FIG. 2A, the distribution of the target luminance TG becomes a curved distribution in which the central portion of the panel is high and the peripheral portion thereof is low. A grayscale value corresponding to a difference (for example, a difference denoted by an arrow in the Figure) between panel luminance LP at a plane position and target luminance TG corresponding thereto, that is, a difference in an image signal value corresponding to a luminance difference denoted by an arrow, becomes ΔV.

In this case, the difference is zero at a central position denoted by • and the correction value at that position becomes ΔV=0. Meanwhile, in the peripheral portion, the panel luminance LP is lowered, but the luminance value is set to be low because the target luminance TG has the curved distribution. Accordingly, the luminance difference of each position becomes a negative value (downward arrow).

To this end, the correction value (V+ΔV) has, for example, a distribution denoted by a solid line H of FIG. 2B.

For example, if a grayscale value of 960 may be given to pixels, grayscale values after correction equal to or less than 960 are distributed.

Figure 28A:
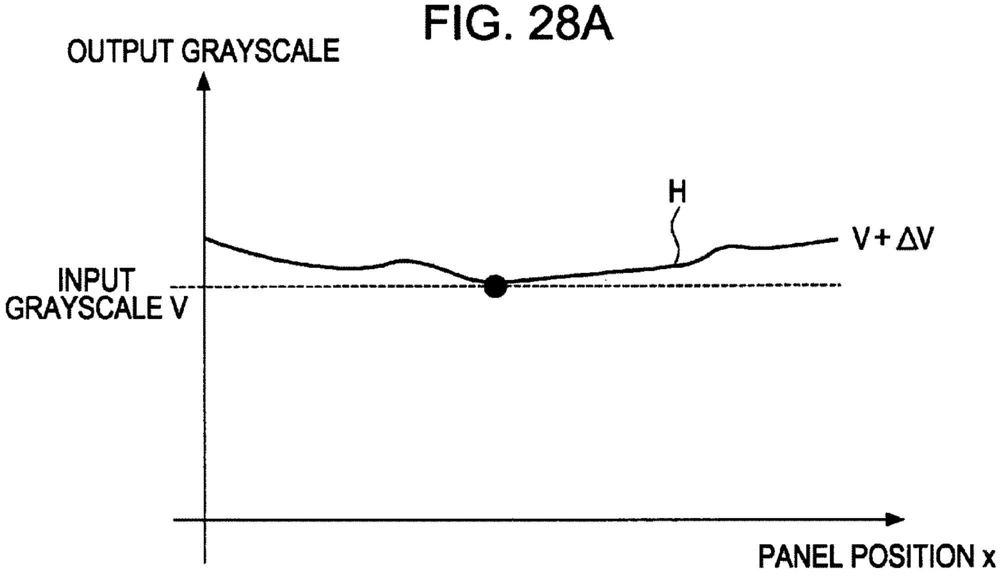
FIGS. 28A and 28B are diagrams illustrating an uncorrectable area in the related art.
Figure 28B:
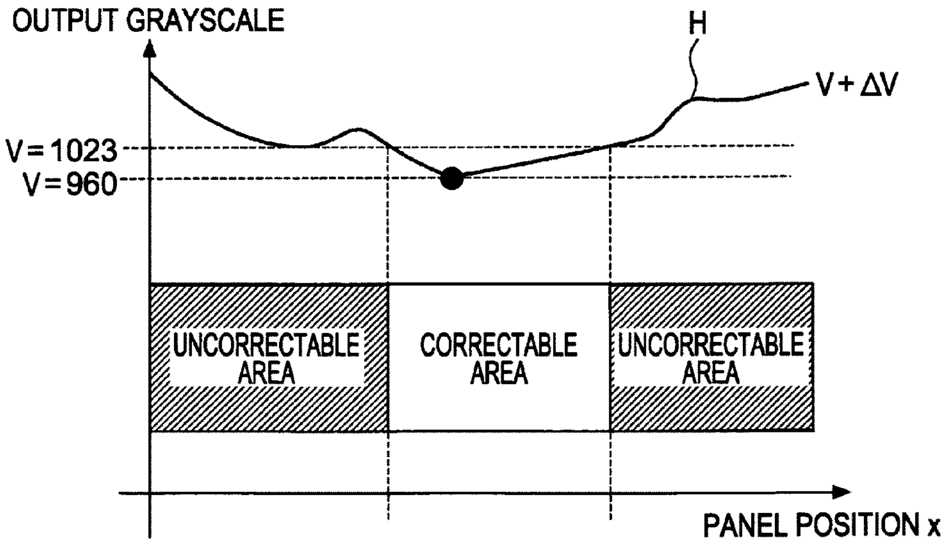
Figures 29A, 29B, 29C, 29D, 29E, 29F:
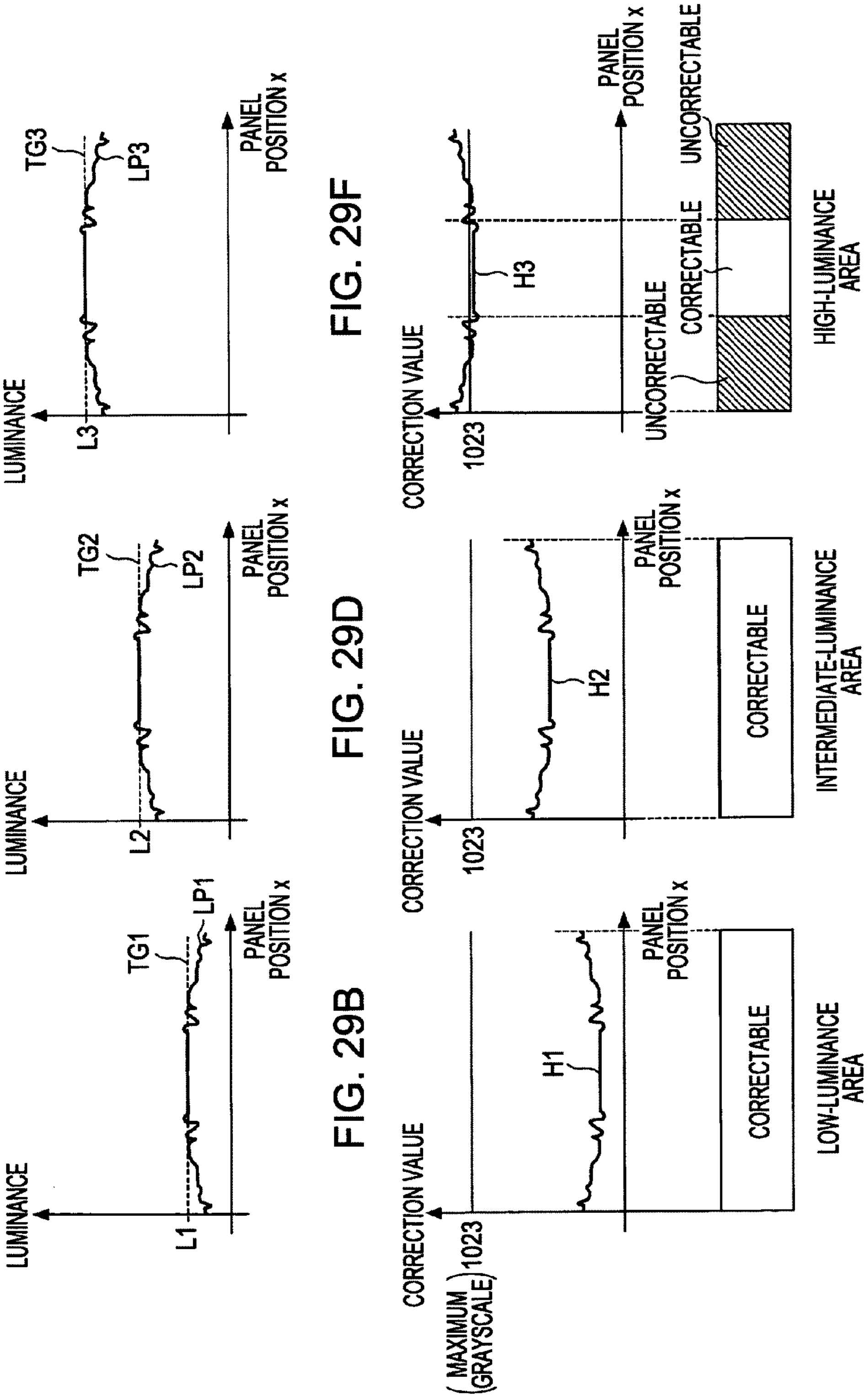
FIGS. 29A to 29F are diagrams illustrating occurrence of an uncorrectable area in a high-luminance area in the related art.
Figure 30:
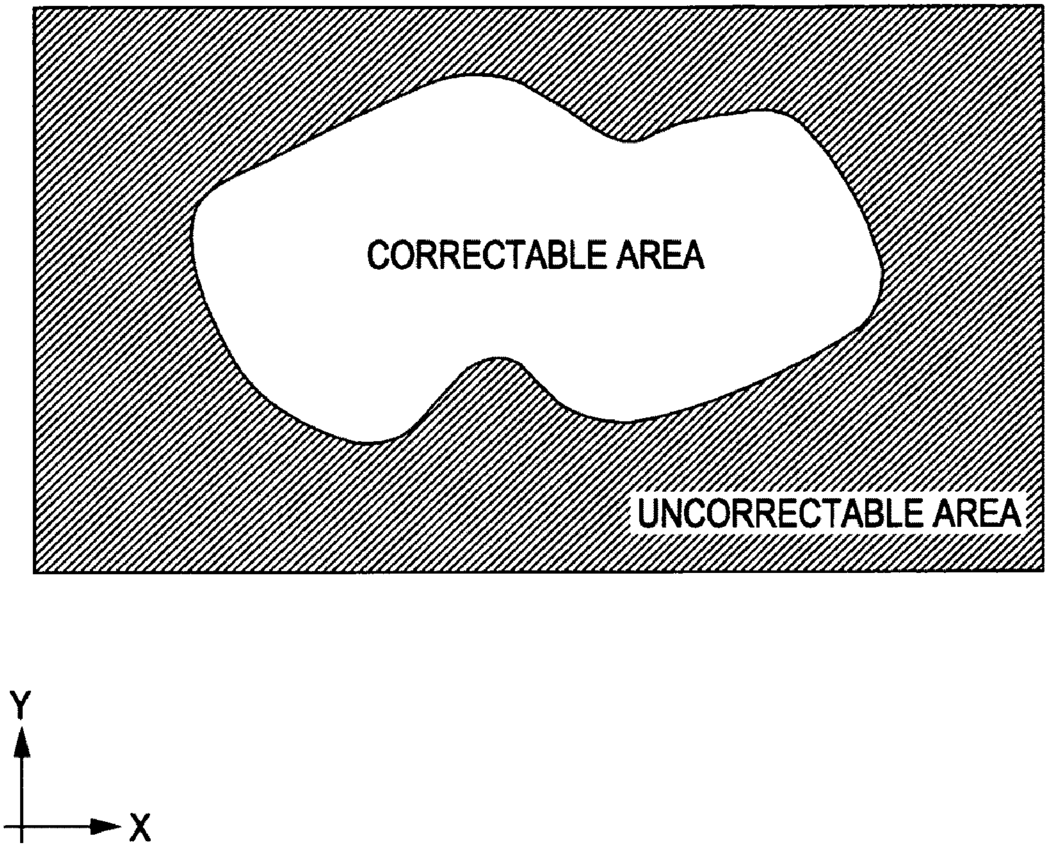
FIG. 30 is an illustration of an uncorrectable area when viewed in a panel plane.

First, as described with reference to FIG. 28B, if the correction value exceeds a maximum grayscale value (for example, 1023), correction may not be performed.

However, in this example, as shown in FIG. 2B, the correction value (V+ΔV) does not exceed the maximum grayscale value (1023). Thus, in a horizontal direction (X direction), the overall range becomes a correctable area.

FIGS. 3A to 3F show luminance areas with low-luminance, intermediate luminance and high luminance.

Figures 3A, 3B, 3C, 3D, 3E, 3F:
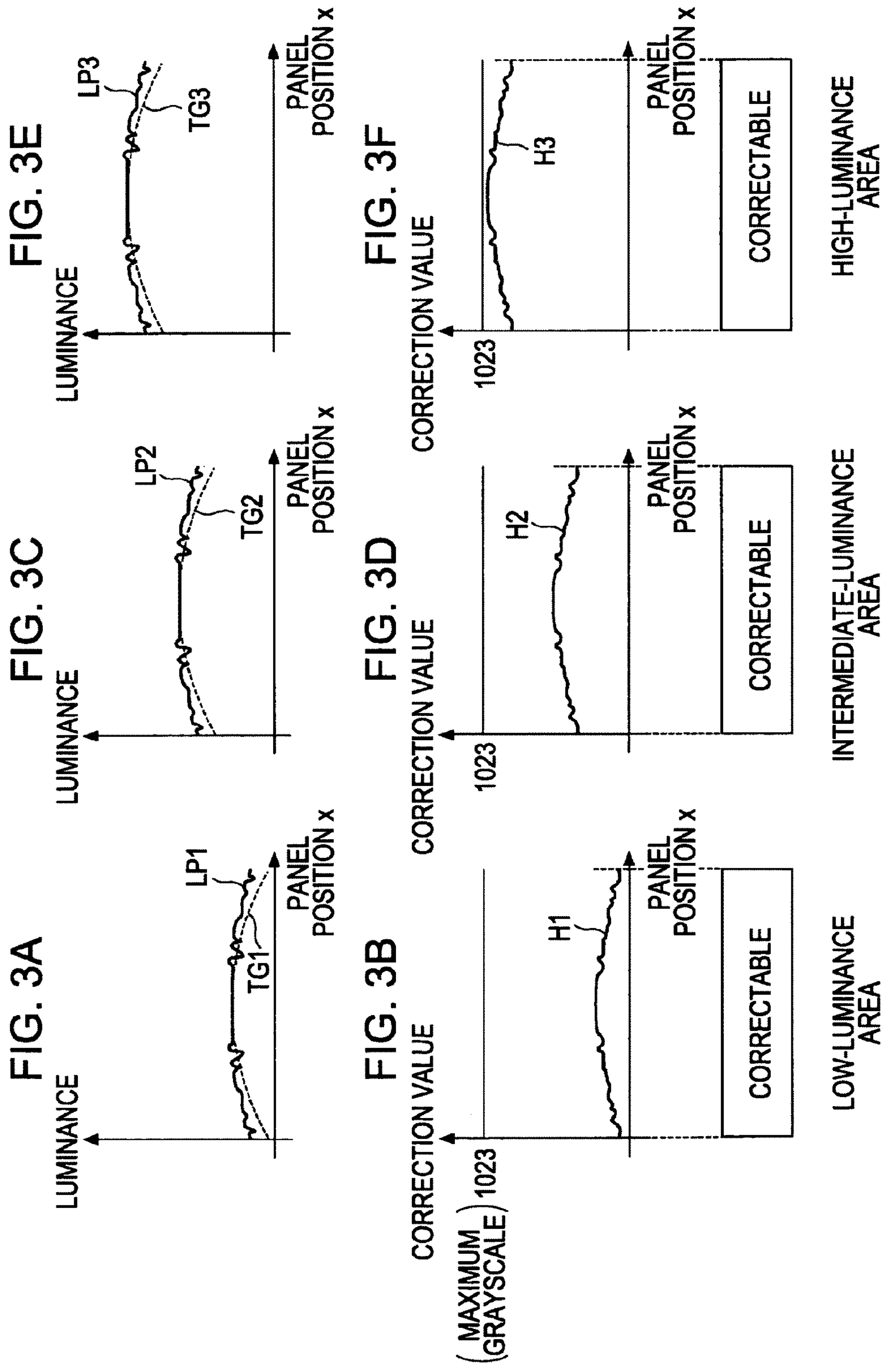
FIGS. 3A to 3F are diagrams illustrating correction value calculation according to an embodiment of the invention.

FIGS. 3A and 3B show the case where a grayscale value corresponding to the luminance L1 of a certain low-luminance area is given to all pixels. FIG. 3A shows panel luminance LP1 and target luminance TG1 corresponding to the luminance L1. In this case, correction values are denoted by a solid line H1 of FIG. 3B.

FIGS. 3C and 3D show the case where a grayscale value corresponding to the luminance L2 of a certain intermediate-luminance area is given to all pixels. FIG. 3C shows panel luminance LP2 and target luminance TG2 corresponding to the luminance L2. In this case, correction values are denoted by a solid line H2 of FIG. 3D.

FIGS. 3E and 3F show the case where a grayscale value corresponding to the luminance L3 of a certain high-luminance area is given to all pixels. FIG. 3E shows panel luminance LP3 and target luminance TG3 corresponding to the luminance L3. In this case, correction values are denoted by a solid line H3 of FIG. 3F.

That is, even in the high-luminance area, since the target luminance corresponding to the pixels is set such that the target luminance TG3 has a curved distribution in the horizontal direction of the panel, it is possible to prevent the correction values from exceeding maximum grayscale. Accordingly, it is possible to perform correction regardless of the plane position of the horizontal direction.

Figure 4:
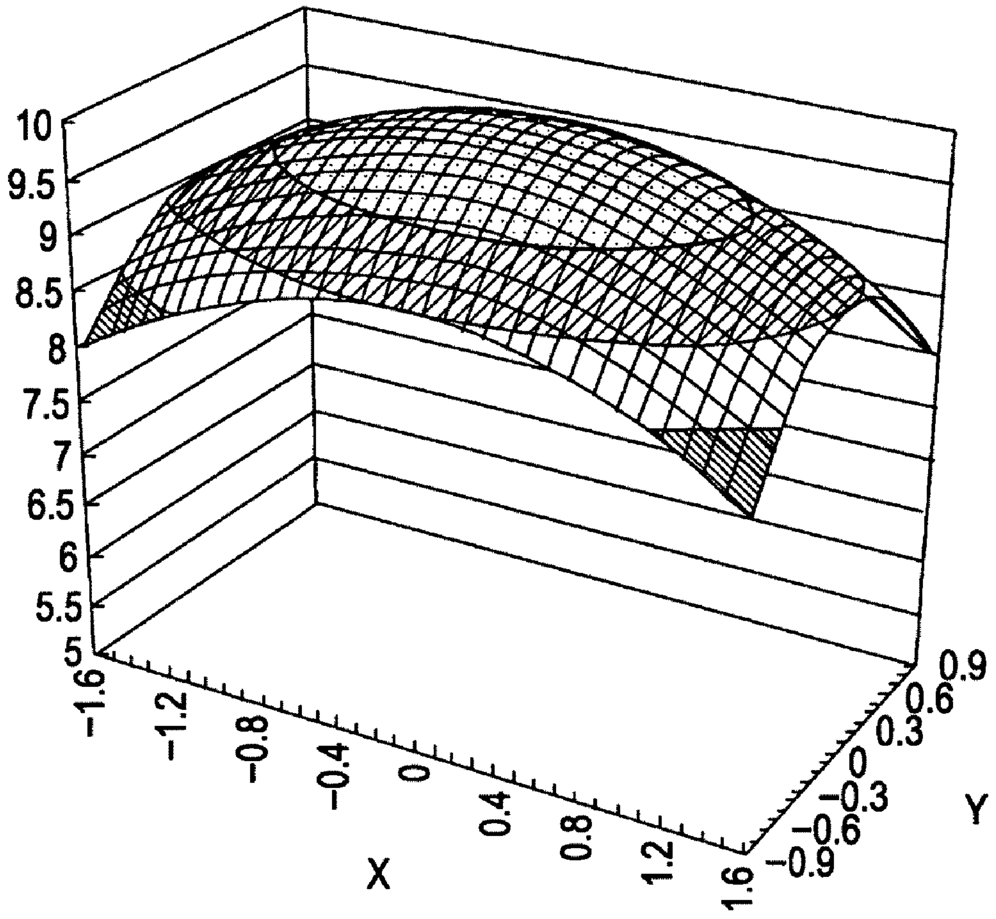
FIG. 4 is a diagram illustrating distribution of target luminance values on a panel plane according to an embodiment of the present invention.

In addition, although the target luminance distribution viewed in the x direction of the panel becomes the curved distribution in FIGS. 1, 2 and 3, the distribution of the target luminance values viewed in the two dimension of the X direction and the Y direction is, for example, shown in FIG. 4.

The distribution of the target luminance has a gradient which is inconspicuous in the X direction and the Y direction.

In the present example, for example, as described above, as the target luminance value of a certain image signal value, a target luminance value which is not uniform in the overall surface of the display panel is set such that the distribution of the target luminance value TG of each plane position of the display panel becomes a curved distribution.

In addition, the correction values of the plane positions of the display panel are calculated using the luminance observed at the plane position of the display panel when one image signal value is given to the overall surface of the display panel and the target luminance value of each plane position of the display panel.

Accordingly, the calculated correction values do not exceed the maximum grayscale. That is, an uncorrectable area is eliminated.

In addition, since the uniform target luminance is not shifted to the low luminance side at the plane position as in the related art, luminance after correction is not wholly lowered.

In the present example, if the distribution of the target luminance value is the curved distribution, the luminance of an image after correction on the screen plane is not uniform when a certain specific grayscale value is uniformly given to the overall screen.

For example, if the distribution of the target luminance value shown in FIG. 4 is set, the luminance of the image after correction is high at the central portion of the screen and the luminance is gradually lowered toward the peripheral portion (particularly, four corners). That is, after correction, uniform luminance may not be obtained in the overall screen plane.

However, the luminance distribution is unperceivable to the long-period vibration characteristic of human vision. In this case, the presence of unevenness is hard to be perceived. That is, actually, adequate unevenness correction is accomplished.

In addition, in the present embodiment, since a property in which a gradual luminance variation is hard to perceive given the characteristics of human vision, the curved distribution of the target luminance value is as smooth as possible.

In contrast, from a property in which the human eye is sensitive to an unevenness variation in a minute range and is insensitive to a panel variation over a large range, the distribution curve of the target luminance is determined.

For example, by an upward convex distribution in which the central portion of the panel is set to a peak and the luminance is lowered to a maximum of 15% or less at four corners as shown in FIG. 4, luminance unevenness are hard to be perceived.

In addition, if the distribution curve of the target luminance is lower than the distribution line of the panel luminance LP as shown in FIG. 1, the correction value calculated at a certain plane position does not exceed the maximum grayscale and thus adequate correction can be performed over the whole range.

In addition, the distribution curve of the target luminance may not necessarily be lower than that distribution line of the panel luminance LP at every position.

That is, if the target luminance value is distributed in a range which does not exceed a maximum luminance value (for example, a luminance value denoted by • of FIG. 2A) of the panel luminance LP, the correction value is not equal to or more than the maximum grayscale value.

However, in the example described with reference to FIGS. 1 to 4, as can be seen from FIG. 1, unevenness, in which the panel luminance LP is high at the central portion of the panel and the luminance is lowered toward the peripheral portion thereof, occur. The unevenness of the panel luminance LP are substantially symmetrical with respect to a central line when viewed in the X direction (and the Y direction).

As the luminance unevenness of the plane direction are due to the structure of the panel, generally, the panel luminance distribution has a peak at the central portion and is lowered to the peripheral portion. In this case, as the distribution of the target luminance value, as shown in FIG. 4, a curved distribution in which luminance is high at the central portion of the panel and is gradually lowered toward the peripheral portion is suitable.

However, the distribution of the panel luminance LP may be different from the above-described distribution.

Figure 5A:
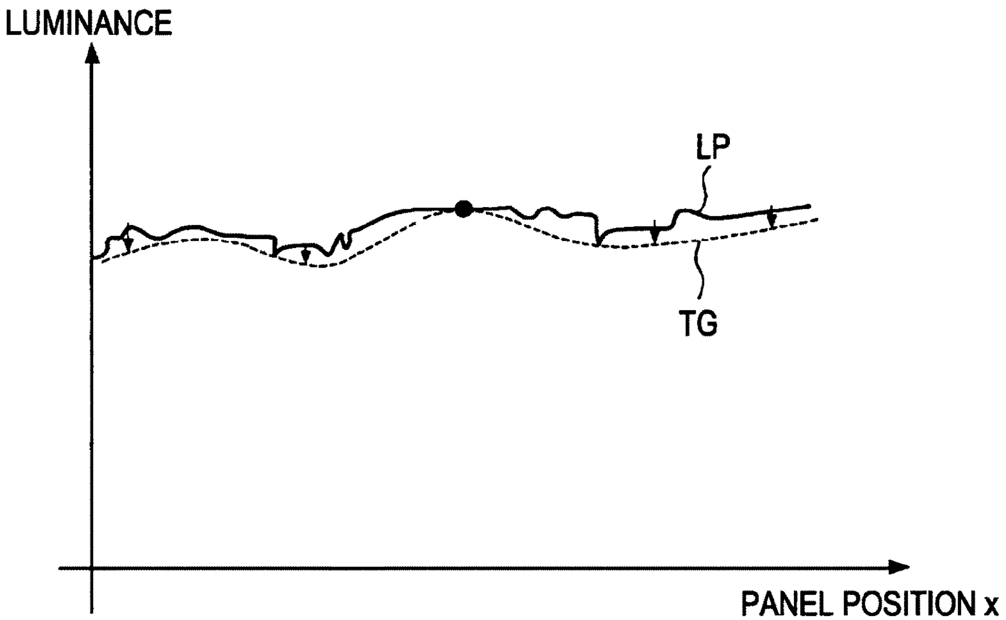
FIGS. 5A and 5B are diagrams illustrating another distribution example of target luminance values according to an embodiment of the present invention.

For example, FIG. 5A shows another example of the distribution of the panel luminance LP. This is not substantially symmetrical with respect to the peak of the central portion. For example, the distribution of the panel luminance LP may be obtained.

Actually, the distribution of the target luminance value is suitably set according to the distribution of the panel luminance LP.

In detail, the target luminance value of any one image signal value at each plane position of the display panel is set so as to become a curved distribution represented by a curve obtained by reducing the frequency of a curve of a variation in luminance value at each plane position of the display panel observed when one image signal value is given to the overall surface of the display panel.

Only in the X direction, as a curve which is obtained by extracting a low frequency component from the curve of the panel luminance LP as a solid line of FIG. 5A, a distribution curve of target luminance TG is set as denoted by a dotted line. That is, a curve obtained by smoothing the distribution curve of the panel luminance LP is set to the distribution curve of the target luminance TG.

From a difference between the target luminance TG and the panel luminance LP at each position, a correction value of each position (each pixel) is calculated.

Even in this case, if the distribution of the target luminance TG is a smoothly curved distribution, the human eye may not sense luminance unevenness after correction.

In addition, the difference at each position is small as the distribution curve of the target luminance is close to the distribution curve of the panel luminance LP. This means that the correction value at each position becomes a small value.

If the correction value is small, the number of bits may be small as a digital value representing the correction value. Then, in the below-described display device, the capacity necessary for a table for storing correction values may be decreased.

In FIG. 5A, since the distribution of the target luminance TG denoted by a dotted line is in a range which does not exceed the maximum luminance value (luminance value denoted by •) of the panel luminance LP, the correction value is prevented from being equal to or more than the maximum grayscale value and an uncorrectable area does not Occur.

The distribution of the target luminance TG may exceed the maximum luminance value of the panel luminance LP.

Figure 5B:
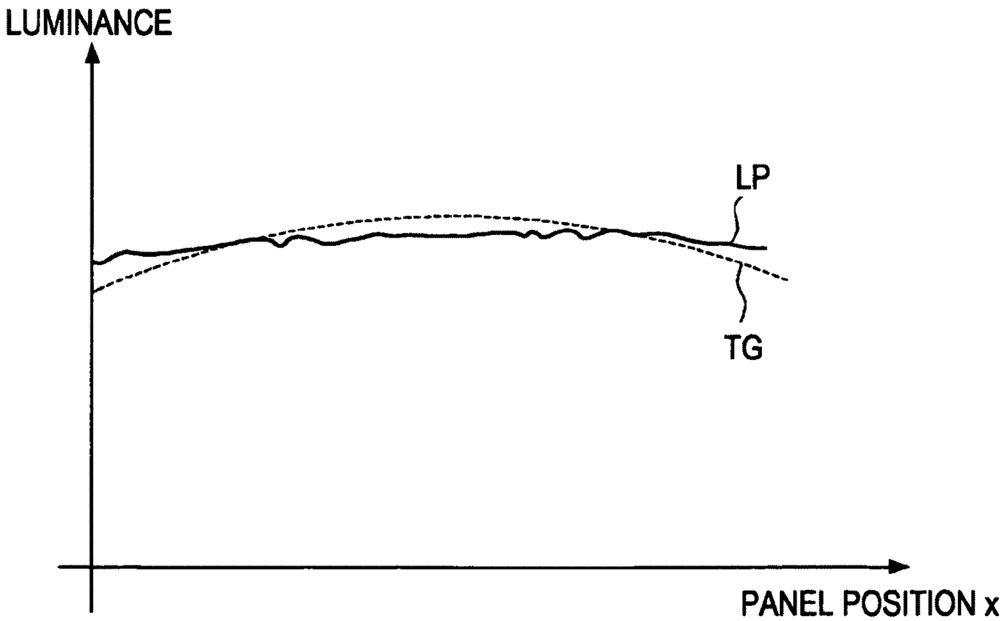

For example, FIG. 5B shows another example. In this case, a portion (a central portion of the X direction) of the distribution of the target luminance TG is higher than the maximum luminance value of the panel luminance LP.

In the correction value of a pixel located at a position where the target luminance TG is higher than the panel luminance LP, $\Delta V$ becomes a positive value. That is, the correction value ($V+\Delta V$) becomes a correction value for correcting the image signal value to the maximum grayscale side.

However, if the image signal value (grayscale value) after correction does not exceed the maximum grayscale value of the display pane, an uncorrectable area does not occur.

As a result, in order to prevent an uncorrectable area from occurring, the distribution of the target luminance value, in which the grayscale value after correction does not exceed the maximum grayscale, is set.

Actually, for simplification of a target setting process or the like, as described above, the distribution of the target luminance TG is preferably in a range which does not exceed the maximum luminance value of the panel luminance LP.

Figure 11:
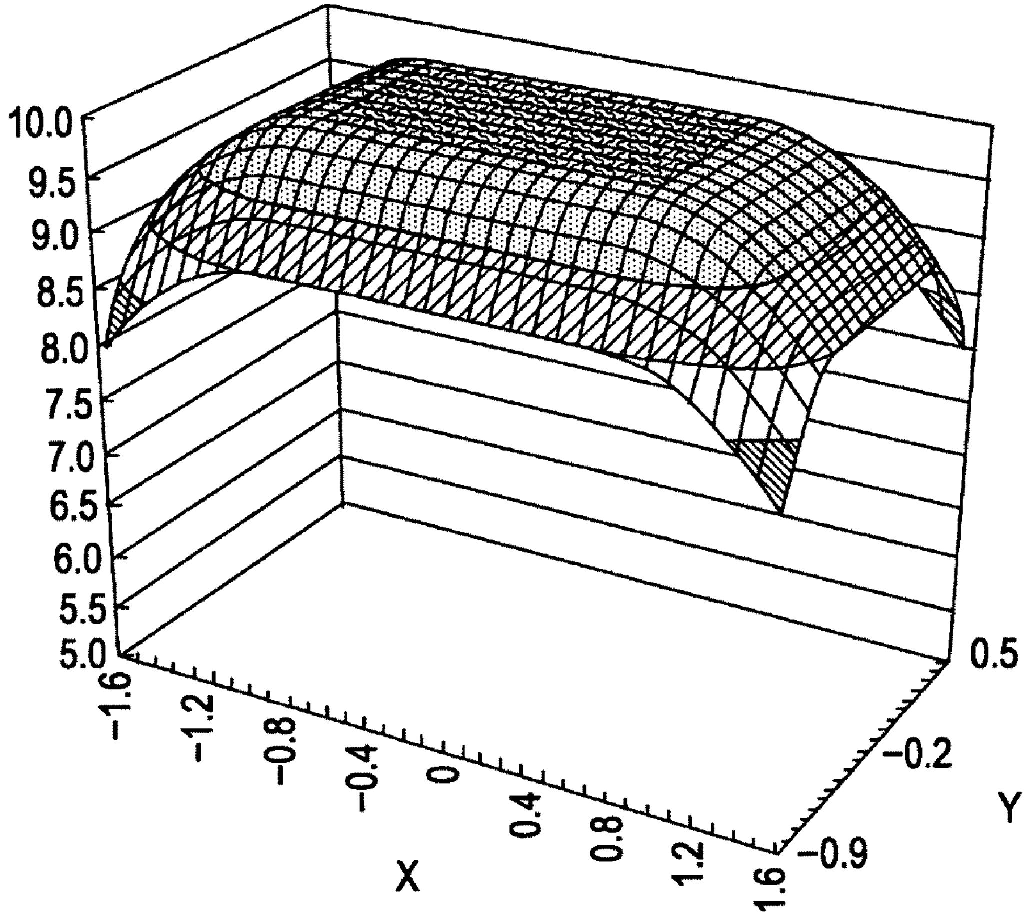
FIG. 11 is a diagram illustrating a distribution example of target luminance values according to an embodiment of the present invention.
Figure 14:
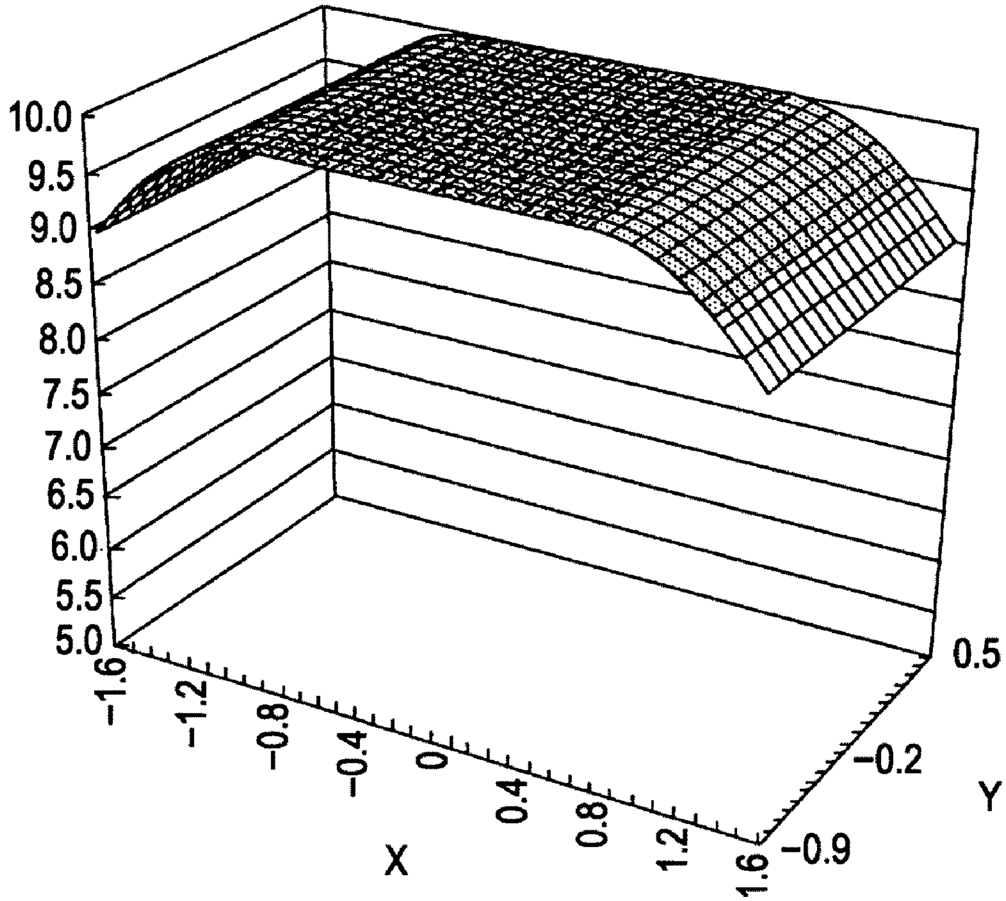
FIG. 14 is a diagram illustrating a distribution example of target luminance values according to an embodiment of the present invention.

In addition, in the example of FIGS. 1 and 5 suggested in the X-axis direction and FIG. 4 suggested in the XY plane, the distribution is wholly curved when viewed in the screen plane direction, but the target luminance distribution may not be curved in the overall screen plane. For example, as shown in FIGS. 11 and 14, there may be a flat distribution in the central portion of the screen and there may be a curved distribution in the peripheral portion thereof. That is, there is a curved distribution in a portion of the screen.

2. Detailed Example of Target Setting

Now, the detailed example of the setting of the target luminance value will be described.

First, the example of the case where the target luminance value having a curved distribution in which the central portion of the panel is set to the peak and the luminance of four corners is lowered as shown in FIG. 4 is set will be described using FIGS. 6 and 7.

In FIG. 4, the X direction and the Y direction of the screen plane are shown and the horizontal position of the screen is in a range from −1.6 to 1.6 as the X value. The vertical position of the screen is in a range from −0.9 to 0.9 as the Y value. The height of the luminance value is represented by a value from "5" to "10" in a direction perpendicular to the XY plane.

FIG. 6 shows the luminance values of the X and Y coordinate values using the following functional equation with respect to a certain grayscale value.

$$L\text{target}=L\text{top}-A(x/x0)^2-B(/y0)^2 \quad \text{(Functional Equation 1)}$$

In addition, FIG. 6 shows the luminance values of the X and Y coordinate points in a state in which a horizontal direction denotes the X coordinate and a vertical direction denotes the Y coordinate.

Ltarget is a two-dimensional luminance distribution which is a target in a corrected grayscale surface.

x is the X-direction coordinate of the panel.

y is the Y-direction coordinate of the panel.

Ltop is highest luminance in the plane, and coincides, for example, with the luminance of the panel center (the coordinate point of (X, Y)=(0,0)) and is "10" in FIG. 6.

A, B, x0, y0 and x1 and y1 used in the following functional equation are constants.

For example, the target luminance of each coordinate point obtained by Functional Equation 1 is shown in FIG. 6 in a state of A=1, B=1, x0=1.6 and y0=0.9.

By Functional Equation 1, it is possible to set target luminance with the curved distribution shown in FIG. 4.

In addition, the following Functional Equation 2 may be used.

$$L\text{target}=L\text{top}+A(\cos(x/x0)-1)+B(\cos(y/y0)-1) \quad \text{(Functional Equation 2)}$$

The target luminance of each coordinate point in this case is shown in FIG. 7. Even by Functional Equation 2, it is possible to set target luminance with the curved distribution shown in FIG. 4, although slightly different from Functional Equation 1.

Figure 8:
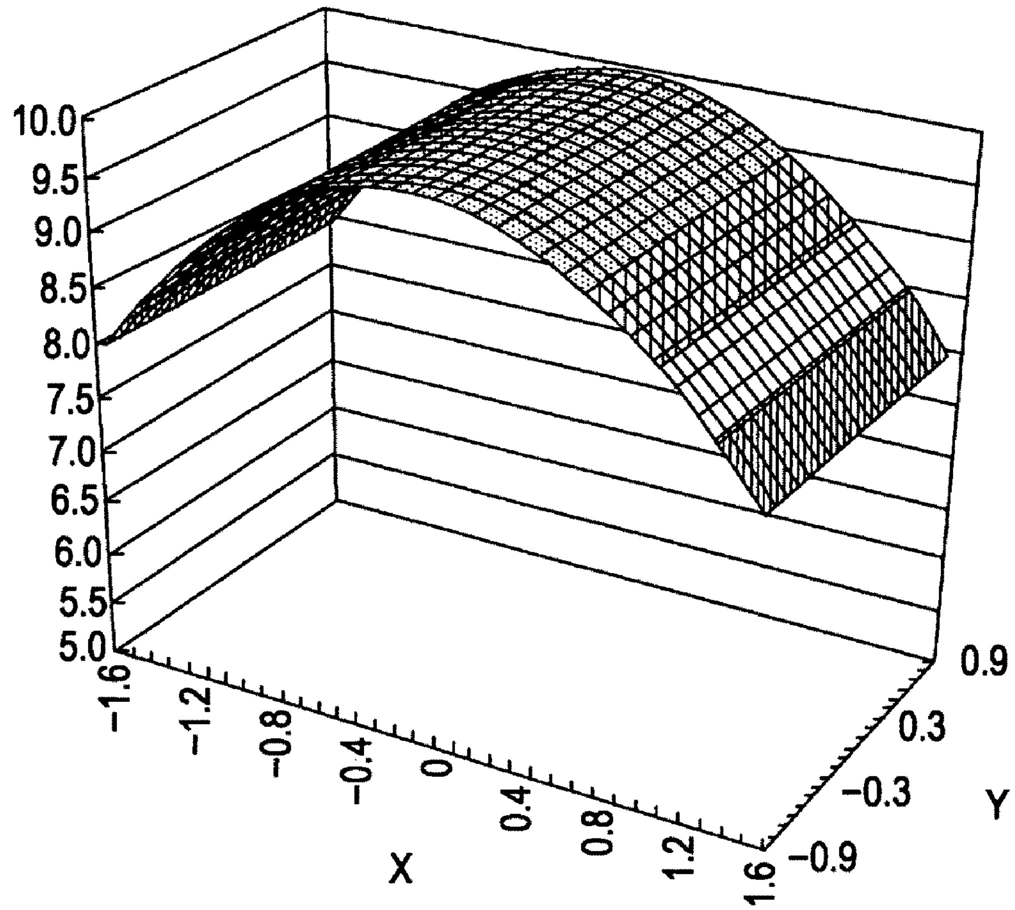
FIG. 8 is a diagram illustrating a distribution example of target luminance values according to an embodiment of the present invention.

FIG. 8 shows another example of the curved distribution of the target luminance. As shown, on the screen plane, the target luminance value is curved in the X direction and is flush in the Y direction.

In order to form such a curved distribution, the target luminance value of each coordinate point is calculated using the following Functional Equation 3.

$$L\text{target}=L\text{top}-A(x/x0)^2 \quad \text{(Functional Equation 3)}$$

The target luminance of each coordinate point obtained in this case is shown in FIG. 9. In addition, constants A=2 and x0=1.6 are set.

Target luminance values become the same value in the Y direction and become different values in the X direction such that the curved distribution is formed.

In addition, the following Functional Equation 4 may be used.

$$L\text{target}=L\text{top}+A(\cos(x/x0)-1) \quad \text{(Functional Equation 4)}$$

The target luminance of each coordinate point in this case is shown in FIG. 10. Even by Functional Equation 4, it is possible to set target luminance with the curved distribution shown in FIG. 8, although slightly different from Functional Equation 3.

FIG. 11 shows another example of the curved distribution of the target luminance. As shown, the distribution is curved so as to lower the luminance value at the four corners of the screen, but a predetermined range of the screen center becomes a uniform distribution area in which the target luminance value is uniform.

In order to form such a distribution, for example, the target luminance value of each coordinate point is calculated using the following Functional Equations 5A to 5D.

If |x|<x1 and |y|<y1, $$L\text{target}=L\text{top} \quad \text{(Functional Equation 5A)}$$

If |x|≧x1 and |y|<y1, $$L\text{target}=L\text{top}+A((|x|-x1)/x0)^2 \quad \text{(Functional Equation 5B)}$$

If |x|<x1 and |y|≧y1, $$L\text{target}=L\text{top}+B((|y|-y1)/y0)^2 \quad \text{(Functional Equation 5C)}$$

If |x|≧x1 and |y|≧y1, $$L\text{target}=L\text{top}+A((|x|-x1)/x0)^2+B((|y|-y1)/y0)^2 \quad \text{(Functional Equation 5D)}$$

In this case, the target luminance of each coordinate point obtained using a constant A=−1, a constant B=−1, a constant x0=x1=0.8, a constant y0=y1=0.45 is shown in FIG. 12.

As the central portion of the screen, in the area having an X coordinate value of −0.8<x<0.8 and a Y coordinate value of −0.45<y<0.4, the target luminance value of each coordinate becomes 10 by Functional Equation 5A.

In addition, an area which becomes the central portion in the Y direction of the left and right areas of the screen uses Functional Equation 5B. That is, in an area having an X coordinate value of x≦−0.8 and a Y coordinate value of −0.45<y<0.45 and an area having an X coordinate value of 0.8≦x and a Y coordinate value of −0.45<y<0.45, the target luminance value of each coordinate is obtained by Functional Equation 5B.

An area which becomes the central portion in the upper and lower areas of the screen of the X direction uses Functional Equation 5C. That is, in an area having an X coordinate value of −0.8<x<0.8 and a Y coordinate value of −0.45≧y and an area having an X coordinate value of −0.8<x<0.8 and a Y coordinate value of y≧0.45, the target luminance value of each coordinate is obtained by Functional Equation 5C.

In the four corner areas of the screen, Functional Equation 5D is used. That is, in the following four areas surrounded by a thick line of FIG. 12, the target luminance value of each coordinate is obtained by Functional Equation 5D.

Area having an X coordinate value of $-0.8 \geqq x$ and a Y coordinate value of $-0.45 \geqq y$ (the left upper area of FIG. 12)

Area having an X coordinate value of $-0.8 \geqq x$ and a Y coordinate value of $0.45 \geqq y$ (the left lower area of FIG. 12)

Area having an X coordinate value of $0.8 \leqq x$ and a Y coordinate value of $-0.45 \geqq y$ (the right upper area of FIG. 12)

Area having an X coordinate value of $0.8 \leqq x$ and a Y coordinate value of $0.45 \leqq y$ (the right lower area of FIG. 12)

If the target luminance of each coordinate point is set as shown in FIG. 12, the target luminance distribution becomes a distribution which is uniform in the central portion of the screen and is curved in the portion other than the central portion as shown in FIG. 11.

In order to form the distribution shown in FIG. 11, for example, the target luminance value of each coordinate point is calculated using the following Functional Equations 6A to 6D.

If $|x|<x\mathbf{1}$ and $|y|<y\mathbf{1}$, $$L\text{target}=L\text{top} \quad \text{(Functional Equation 6A)}$$

If $|x| \geqq x\mathbf{1}$ and $|y|<y\mathbf{1}$, $$L\text{target}=L\text{top}+A(\cos((|x|-x1)/x0)-1) \quad \text{(Functional Equation 6B)}$$

If $|x|<x\mathbf{1}$ and $|y| \geqq y\mathbf{1}$, $$L\text{target}=L\text{top}+B(\cos((|y|-y1)/y0)-1) \quad \text{(Functional Equation 6C)}$$

If $|x| \geqq x\mathbf{1}$ and $|y| \geqq y\mathbf{1}$, $$L\text{target}=L\text{top}+A(\cos((|x|-x1)/x0)-1+B(\cos((|y|-y1)/y0)-1 \quad \text{(Functional Equation 6D)}$$

The target luminance of each coordinate point obtained in this case is shown in FIG. 13.

In the area of the central portion of the screen, the target luminance value of each coordinate becomes 10 by Functional Equation 6A.

In addition, in the area which becomes the central portion in the Y direction of the left and right areas of the screen, the target luminance value of each coordinate is obtained by Functional Equation 6B.

In the area which becomes the central portion in the X direction of the upper and lower areas of the screen, the target luminance value of each coordinate is obtained by Functional Equation 6C.

In the four corner areas of the screen, Functional Equation 6D is used. That is, in the four areas surrounded by a thick line of FIG. 13, the target luminance value of each coordinate is obtained by Functional Equation 6D.

Even when the target luminance of each coordinate point is set as shown in FIG. 13, the target luminance distribution becomes a distribution which is curved only in the peripheral portion as shown in FIG. 11, although slightly different from FIG. 12.

FIG. 14 shows another example of the curved distribution of the target luminance. This is an example of a distribution in which the target luminance value is curved in the X direction in the screen plane, is flush in the Y direction and is flat in the central portion of the screen.

In order to form such a distribution, for example, the target luminance value of each coordinate point is calculated using the following Functional Equations 7A and 7B.

If $|x|<x\mathbf{1}$, $$L\text{target}=L\text{top} \quad \text{(Functional Equation 7A)}$$

If $|x| \geqq x\mathbf{1}$, $$L\text{target}=L\text{top}-A((|x|-x1)/x0)^2 \quad \text{(Functional Equation 7B)}$$

The target luminance of each coordinate point using a constant $x\mathbf{0}=x\mathbf{1}=0.8$ obtained in this case is shown in FIG. 15.

As the central portion of the screen, in an area having an X coordinate value of $-0.8 \leqq x \leqq 0.8$, the target luminance value of each coordinate becomes 10 by Functional Equation 7A.

In an area having an X coordinate value of $x<-0.8$ and an area having an X coordinate value of $0.8<x$ of the left and right areas of the screen, the target luminance value of each coordinate is obtained by Functional Equation 7B.

When the target luminance of each coordinate point is set as shown in FIG. 15, the target luminance distribution becomes a distribution which is uniform in the central portion of the screen and is curved in the left and right sides of the central portion as shown in FIG. 14.

In order to form the distribution shown in FIG. 14, for example, the target luminance value of each coordinate point may be calculated using the following Functional Equations 8A and 8B.

If $|x|<x\mathbf{1}$, $$L\text{target}=L\text{top} \quad \text{(Functional Equation 8A)}$$

If $|x| \geqq x\mathbf{1}$, $$L\text{target}=L\text{top}+A(\cos((|x|-x1)/x0)-1) \quad \text{(Functional Equation 8B)}$$

The target luminance of each coordinate point obtained in this case is shown in FIG. 16.

In the central portion of the screen, the target luminance value of each coordinate becomes 10 by Functional Equation 8A.

In the left and right areas of the screen, the target luminance value of each coordinate is obtained by Functional Equation 8B.

In order to set the target luminance of each coordinate point as shown in FIG. 16, the target luminance distribution substantially becomes the distribution shown in FIG. 14, although slightly different from FIG. 15.

In the above-described examples, by setting the target luminance distribution which becomes the curved distribution in the overall screen as shown in FIGS. 4 and 8, the above-described effect can be obtained. That is, correction can be performed such that a user does not sense unevenness in the overall screen without generating an uncorrectable area.

In the examples of FIGS. 11 and 14, a curved distribution is formed in a portion of the screen plane and a uniform distribution area is formed in the central portion of the panel. Even in this case, the same effect as FIGS. 4 and 8 can be obtained. In addition, since the user pays attention to the central portion of the screen, it is preferable that the target luminance value is set such that the uniform distribution is formed only in the central portion and unevenness correction in the central portion is solved with certainty, in view of high image quality.

Although eight examples are described as the detailed example for setting the target luminance, a plurality of examples may be considered as the actually employable function operation example or the distribution shape of the curved distribution. The examples are only exemplary.

In each panel actually manufactured, an original luminance unevenness state is different. Accordingly, a method for preparing a plurality of functional equations and selecting an adequate functional equation according to the result of measuring the unevenness of each panel may be considered.

3. Display device of Embodiment

The embodiment of a display device for performing correction using a correction value calculated using a target luminance value of a curved distribution will be described.

Figure 17:
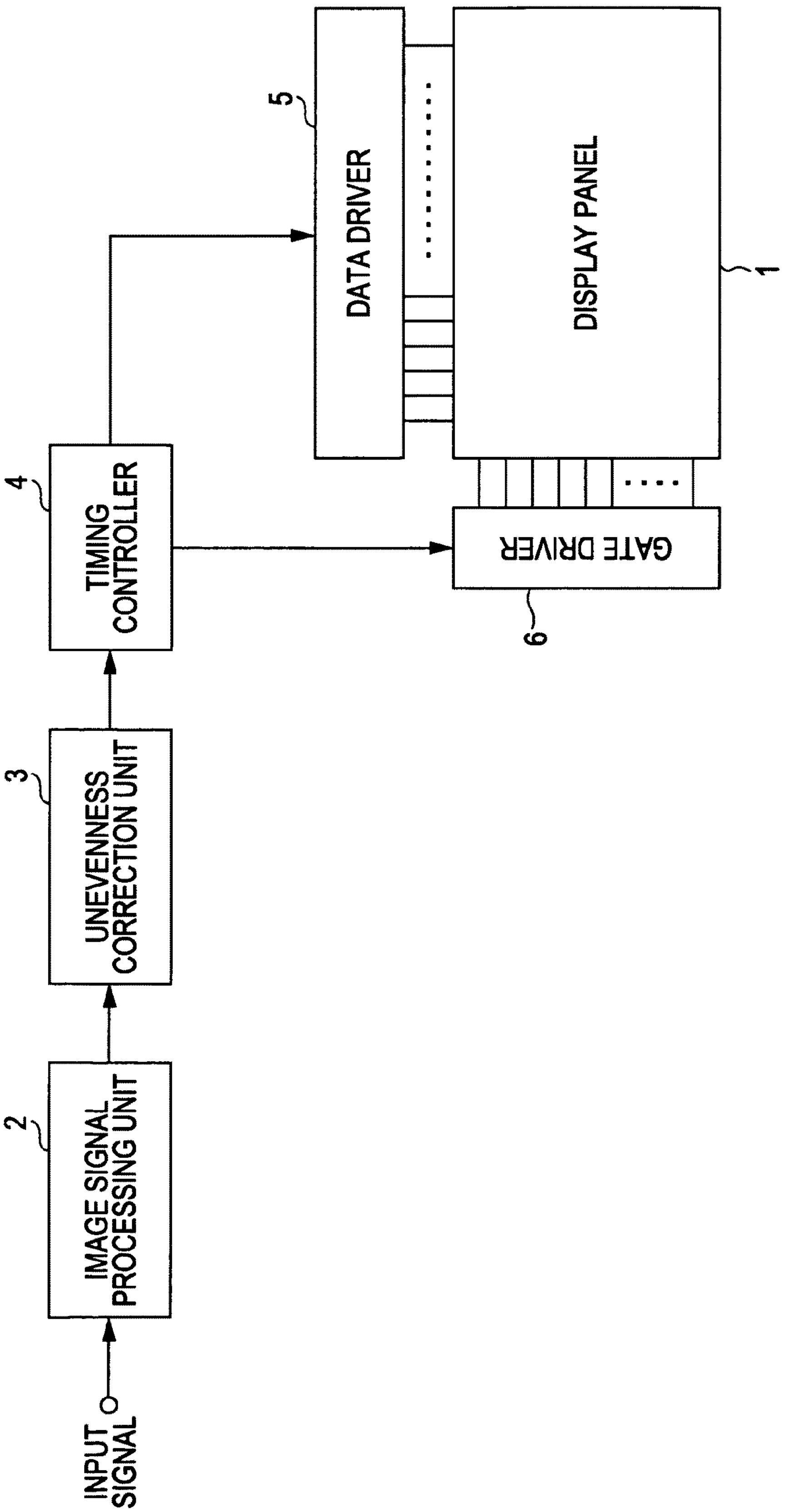
FIG. 17 is a block diagram of a display device according to an embodiment of the present invention.

FIG. 17 is a block diagram showing the configuration of the main portions of a display device according to an embodiment. This display device is applicable to a display device unit of a television receiver, a monitor display device and various types of information device.

An image signal processing unit 2 performs an image signal process according to an input signal. For example, in a television receiver, the input signal becomes a received broadcast signal, and the image signal processing unit 2 performs a process of extracting an image signal from the received signal. In an image playing device, the input signal is a signal read from a recording medium, and the image signal processing unit 2 performs a process of playing an image signal. In a network device, the image signal processing unit 2 performs a process of decoding communication data or the like with respect to the input signal obtained by network communication.

That is, the image signal processing unit 2 indicated here is a portion which extracts an image signal received from a certain transmission path, performs a necessary process, and outputs, for example, an RGB image signal.

The image signals including an R signal, a G signal and a B signal output from the image signal processing unit 2 are supplied to an unevenness correction unit 3. The unevenness correction unit 3 outputs corrected image signal values, which can be obtained by a correction operation, with respect to the input image signal values of R, G and B, as a correction process according to the unevenness characteristics (luminance unevenness and chromaticity unevenness) of a display panel 1. The detail will be described later.

A timing controller 4 sends the RGB image signals corrected by the unevenness correction unit 3 to a data driver 5 at predetermined timing and sends scanning timing to a predetermined gate driver 6.

The display panel 1 is, for example, an organic electroluminescent (EL) display panel, a liquid crystal panel or the like and is completed by arranging pixel circuits in a matrix in a horizontal direction (X direction) and a vertical direction (Y direction). The pixel circuits are driven in the unit of one line by the image signal values supplied from the data driver 5 at line scanning timing of the gate driver 6, thereby performing an image display.

Figure 18:
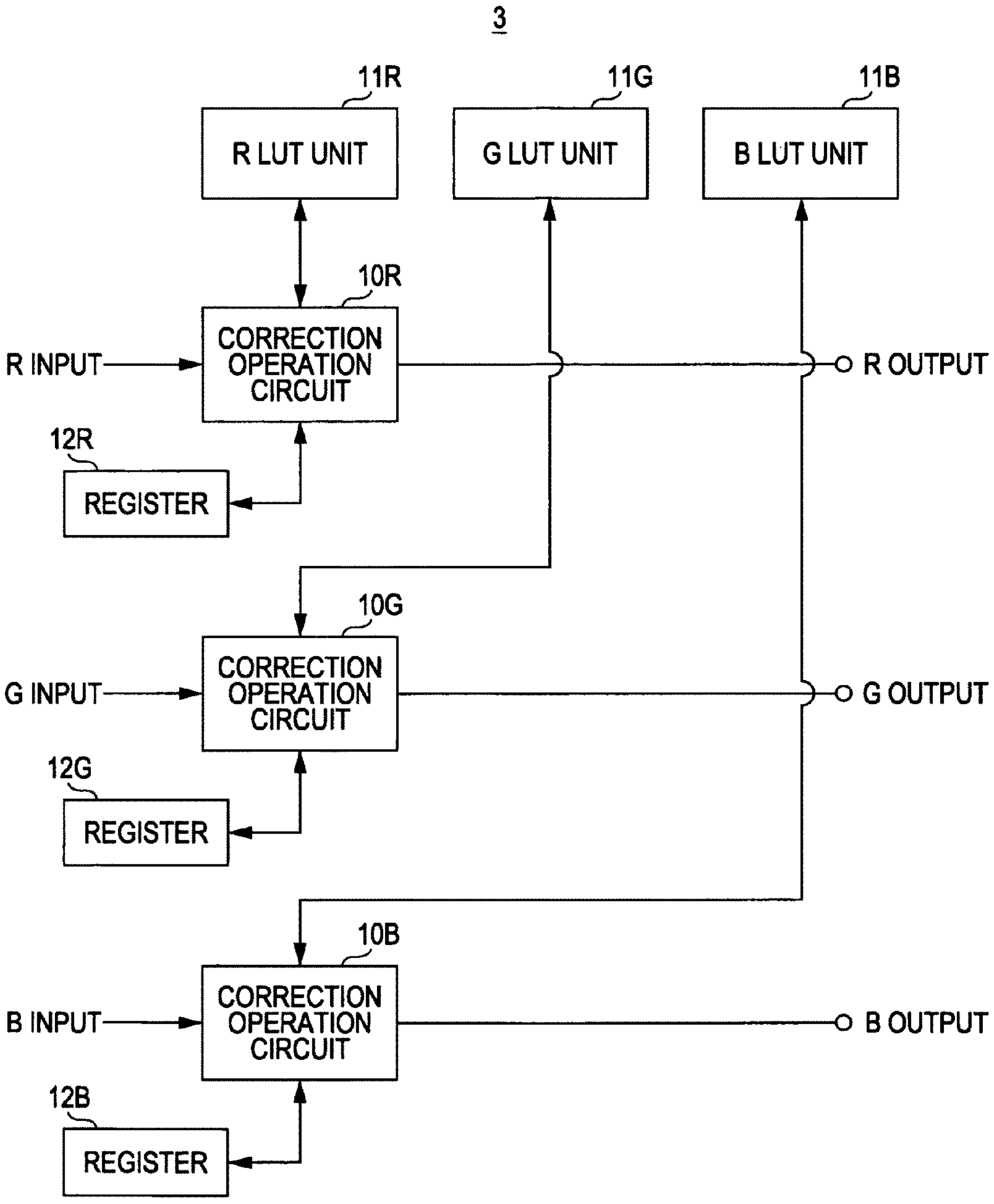
FIG. 18 is a block diagram of an unevenness correction unit according to an embodiment of the present invention.

For example, the configuration example of the unevenness correction unit 3 of the display device is shown in FIG. 18.

The unevenness correction unit 3 includes circuit configurations for performing unevenness correction of the image signal values in correspondence with the R signal, the G signal and the B signal.

As the configuration corresponding to the R signal, an R LUT (lookup table) unit 11R, a correction operation circuit 10R and a register 12R are included.

As the configuration corresponding to the G signal, a G LUT unit 11G, a correction operation circuit 10G and a register 12G are included. As the configuration corresponding to the B signal, a B LUT unit 11B, a correction operation circuit 10B and a register 12B are included.

The R LUT unit 11R, the G LUT unit 11G and the B LUT unit 11B are prepared, for example, using a Dynamic Random Access Memory (D-RAM) or a Synchronous DRAM (SD-RAM) which is one type of the D-RAM.

Figure 19:
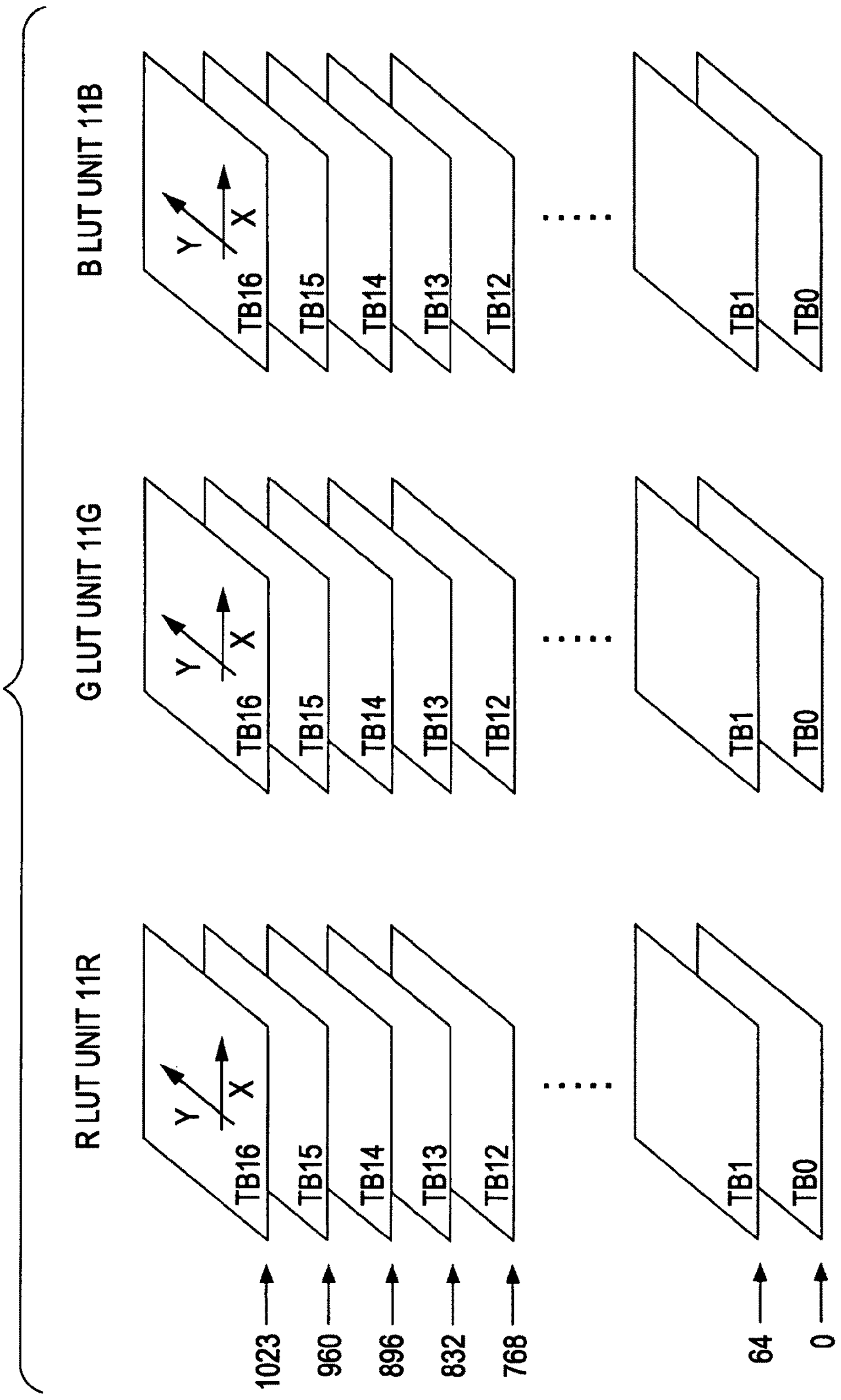
FIG. 19 is a diagram illustrating a lookup table according to an embodiment of the present invention.

In the present example, each of the R LUT unit 11R, the G LUT unit 11G and the B LUT unit 11B includes 17 lookup tables TB0, TB1, . . . , and TB16 as shown in FIG. 19.

FIG. 20 shows an example of dividing grayscale values "0" to "1023" with the same interval as representative input values, but, for example, the lookup tables TB0 to TB16 of FIG. 19 correspond to the representative input values divided with the same interval.

Then, a lookup table TB0 becomes a table memory corresponding to a grayscale value "0", a lookup table TB1 becomes a table memory corresponding to a grayscale value "64", and a lookup table TB16 becomes a table memory corresponding to a grayscale value "1023".

In the lookup tables TB0 to TB16, correction operation values corresponding to pixels in the XY direction of the display panel are stored according to the representative input values.

In the registers 12R, 12G and 12B shown in FIG. 18, the representative input values of the lookup tables TB0 to TB16 of the R LUT unit 11R, the G LUT unit 11G and the B LUT unit 11B are stored.

For example, the values of "0", "64", "128", and "1023" as shown in FIG. 20 are stored as the representative input values of the lookup tables TB0 to TB16.

If the number of lookup tables TB or the representative input values are equal in the R LUT unit 11R, the G LUT unit 11G and the B LUT unit 11B as shown in FIG. 19, the registers 12R, 12G and 12B may not be provided in correspondence with R, G and B and one register may be commonly used in R, G and B. If the number of lookup tables TB or the representative input values are different for each color, it is preferable that the registers 12R, 12G and 12B are provided in correspondence with R, G and B.

The correction values of the lookup tables TB0 to TB16 of the R LUT unit 11R, the G LUT unit 11G and the B LUT unit 11B are calculated as described using FIGS. 1 to 5 (FIGS. 6 to 16 as the detailed examples).

The correction values are, for example, calculated using a computer system or the like in the step of manufacturing the display device and the calculated correction values are stored in the lookup tables TB0 to TB16.

Figure 21:
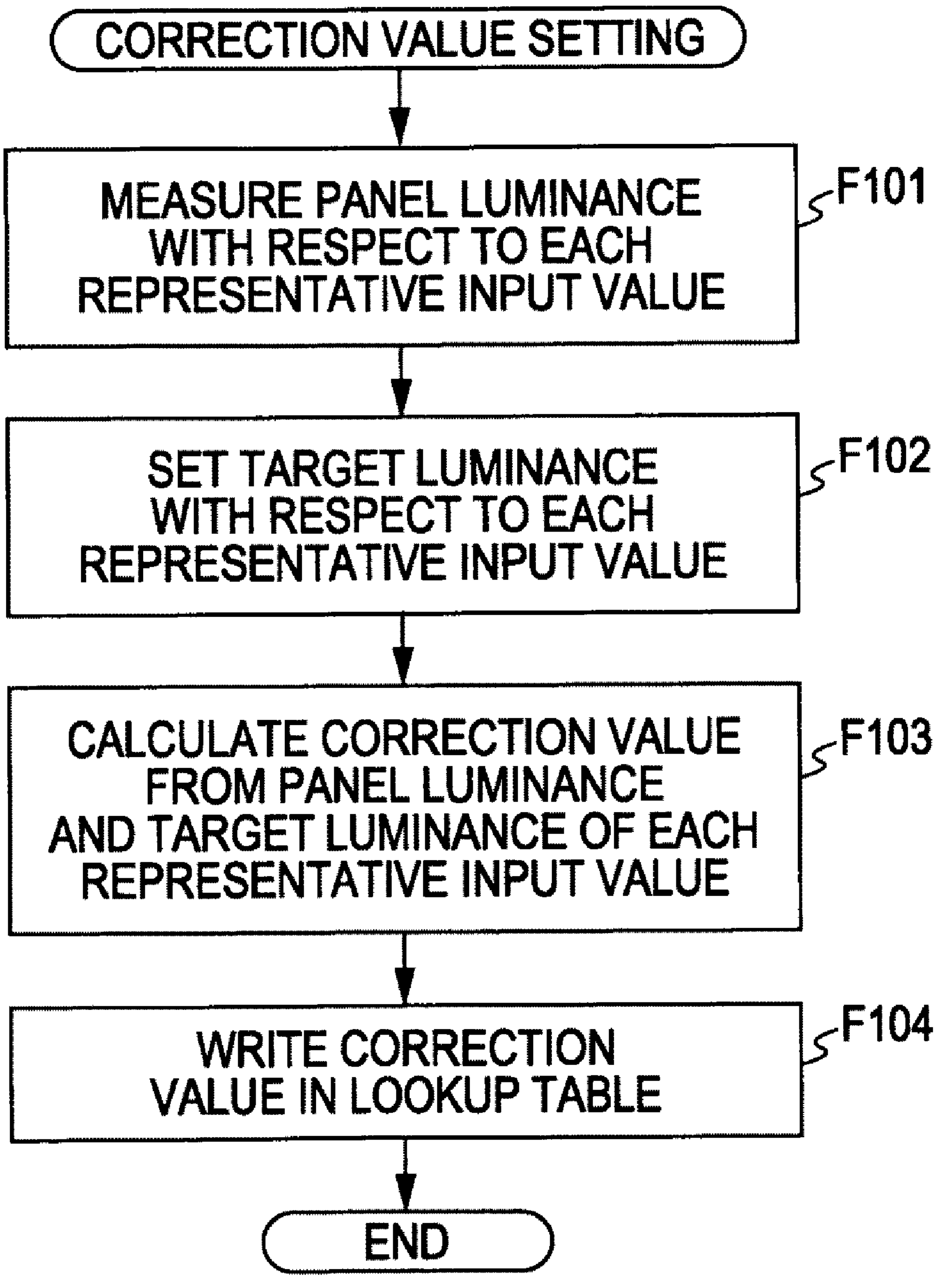
FIG. 21 is a flowchart of a correction value setting process according to an embodiment of the present invention.

FIG. 21 shows a correction value calculating process performed in the step of manufacturing the display device 1.

First, in step F101, the panel luminance LP of each representative input value is measured.

For example, with respect to the calculation of the correction value of the lookup table TB15 of the representative input value "960" of the R LUT unit 11R, the R signal of the grayscale value "960" is supplied to all R pixels of the display panel 1. In this state, the panel luminance of the plane direction is measured and the measured value is input to a computer system.

Such measurement is performed as measurement corresponding to the lookup tables TB0 to TB16 of the representative input values "0" to "1023" of the R LUT unit 11R.

In addition, the measurement of the panel luminance in the plane direction is performed in correspondence with the lookup tables TB0 to TB16 of the G LUT unit 11G and the B LUT unit 11B and the measured values are input to the computer system.

Subsequently, in step F102, from the result of measuring the panel luminance, the setting of the target luminance values is performed.

For example, with respect to the calculation of the correction value of the lookup table TB15 of the representative input value "960" of the R LUT unit 11R, in the process of the step F101, the measured value of the panel luminance in the plane direction can be obtained in a state in which the R signal of the grayscale value "960" is supplied to all R pixels of the display panel 1. This is information shown in the distribution curve of the panel luminance LP shown in FIG. 1.

Accordingly, the target luminance TG in which the distribution is set is set according to the distribution curve.

For example, the target luminance value at each plane position is set in the curved distribution denoted by the dotted line of FIG. 1 distributed in a range lower than the maximum value of the panel luminance LP. Alternatively, as shown in FIG. 5A or 5B, the distribution of the target luminance TG is set and the target luminance value at each plane position is set.

Such target luminance setting is performed in correspondence with the lookup tables TB0 to TB16 of the R LUT unit 11R, the G LUT unit 11G and the B LUT unit 11B.

In step F103, the correction values stored in the lookup tables TB0 to TB16 of the R LUT unit 11R, the G LUT unit 11G and the B LUT unit 11B are calculated.

For example, with respect to the calculation of the correction value of the lookup table TB15 of the representative input value "960" of the R LUT unit 11R, a difference at each plane position is obtained using the panel luminance LP at each plane position when the R signal value of the grayscale value "960" is given to all R pixels, which is obtained in the step F101, and the target luminance TG at each plane position set in the step F102. The grayscale value ΔV according to the difference at each plane position is obtained such that (V+ΔV) is set as the correction value.

The calculation of the correction values is performed in correspondence with the lookup tables TB0 to TB16 of the R LUT unit 11R, the G LUT unit 11G and the B LUT unit 11B.

In step F104, the calculated correction values are written in the lookup tables TB0 to TB16 of the R LUT unit 11R, the G LUT unit 11G and the B LUT unit 11B.

In the above-described process, the correction values are stored in the lookup tables TB0 to TB16 of the R LUT unit 11R, the G LUT unit 11G and the B LUT unit 11B, but the correction values do not exceed maximum grayscale as described above, and an uncorrectable area does not occur. After correction, the correction values are obtained such that unevenness are not perceived by the human visual characteristics.

The correction values corresponding to the representative input values are only stored in the lookup tables TB0 to TB16 of the R LUT unit 11R, the G LUT unit 11G and the B LUT unit 11B.

As the image signal values input to the unevenness correction unit 3, there are values other than the representative input values.

If the input image signal values are grayscale values which are not the representative input values, an interpolation operation is performed using the correction values stored in the lookup tables of the grayscale values before and after them.

For example, the correction values are obtained by a linear interpolation operation. This is described with respect to FIGS. 22A and 22B.

Figure 22A:
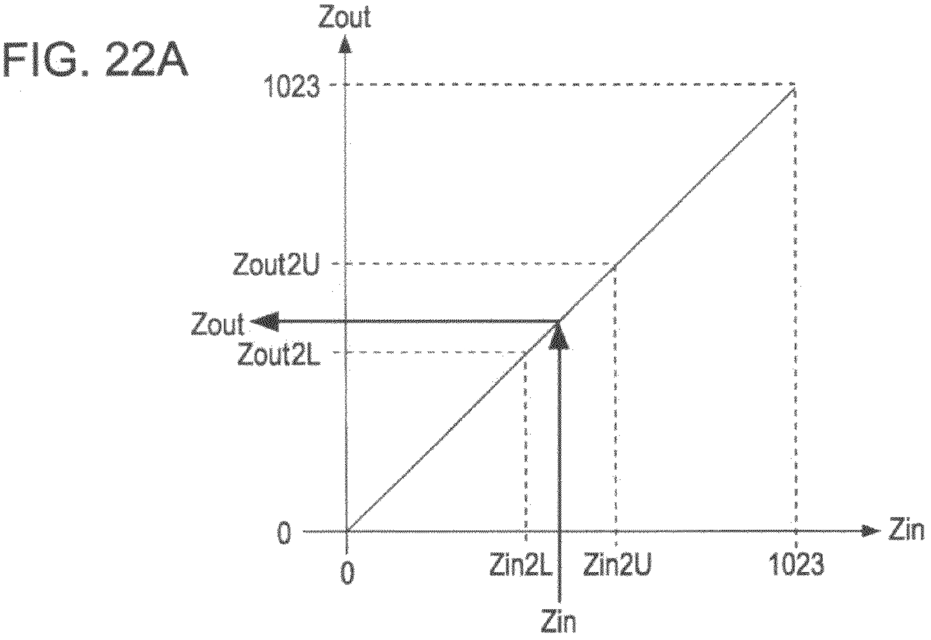
FIGS. 22A and 22B are diagrams illustrating linear interpolation in a correction operation according to an embodiment of the present invention.
Figure 22B:
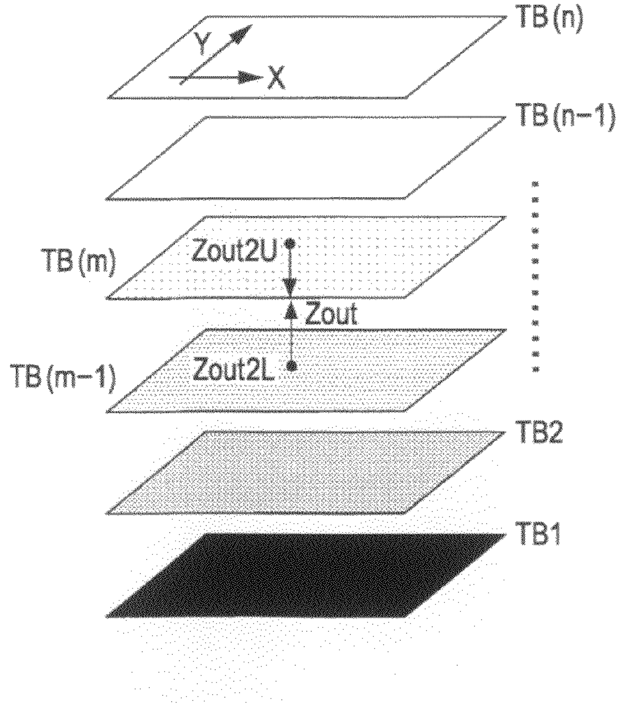

FIG. 22B shows n lookup tables TB1, TB2, . . . , and TB(n) stored in a certain LUT unit 11. For example, the R LUT unit 11R corresponds to the lookup tables TB0 to TB16.

In FIG. 22A, a horizontal axis denotes an input grayscale value and a vertical axis denotes a corrected output grayscale value.

Now, the grayscale value of the input image signal is Zin and the lookup table of the input grayscale value Zin in this case is not prepared.

The input grayscale value Zin is a value between the input grayscale values of the lookup tables TB(m) and TB(m−1) of FIG. 22B.

That is, when the input grayscale value to which the lookup table TB(m) corresponds is Zin2U and the input grayscale value to which the lookup table TB(m−1) corresponds is Zin2L, as shown in FIG. 22A, the input grayscale value Zin is present between the grayscale values Zin2L and Zin2U, which are the representative input values:

Here, the correction values read from the lookup tables TB(m) and TB(m−1) are Zout2U and Zout2L. Then, in the correction operation circuit 101, in order to obtain the corrected output grayscale value Zout, the following operation is performed.

$$Zout=\{Zout2U\times(Zin-Zin2L)+Zout2L\times(Zin2U-Zin)\}/(Zin2U-Zin2L) \quad \text{(Equation 1)}$$

Figure 23:
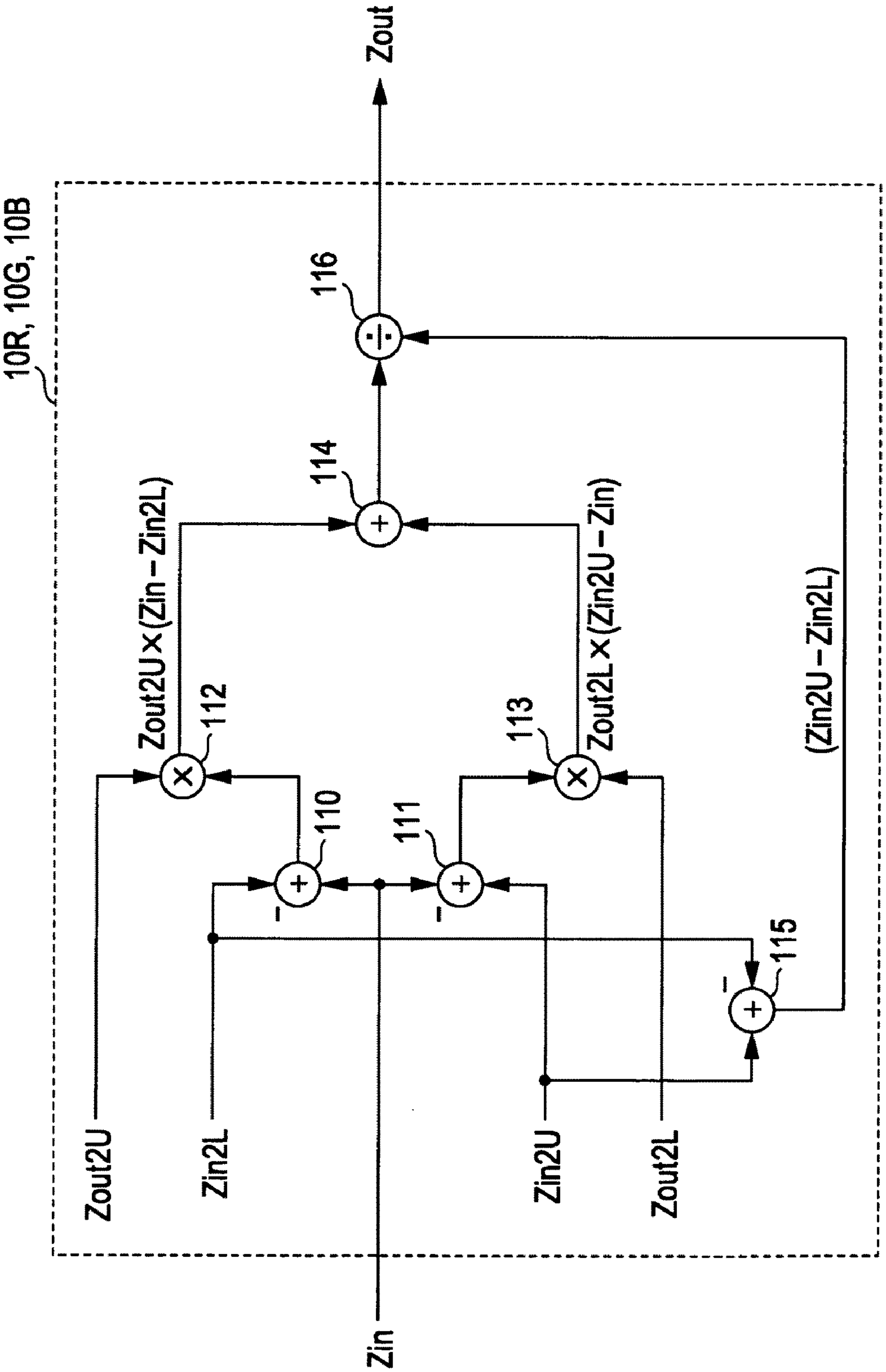
FIG. 23 is a circuit diagram of a correction operation circuit of an unevenness correction unit according to an embodiment of the present invention.
Figure 24:
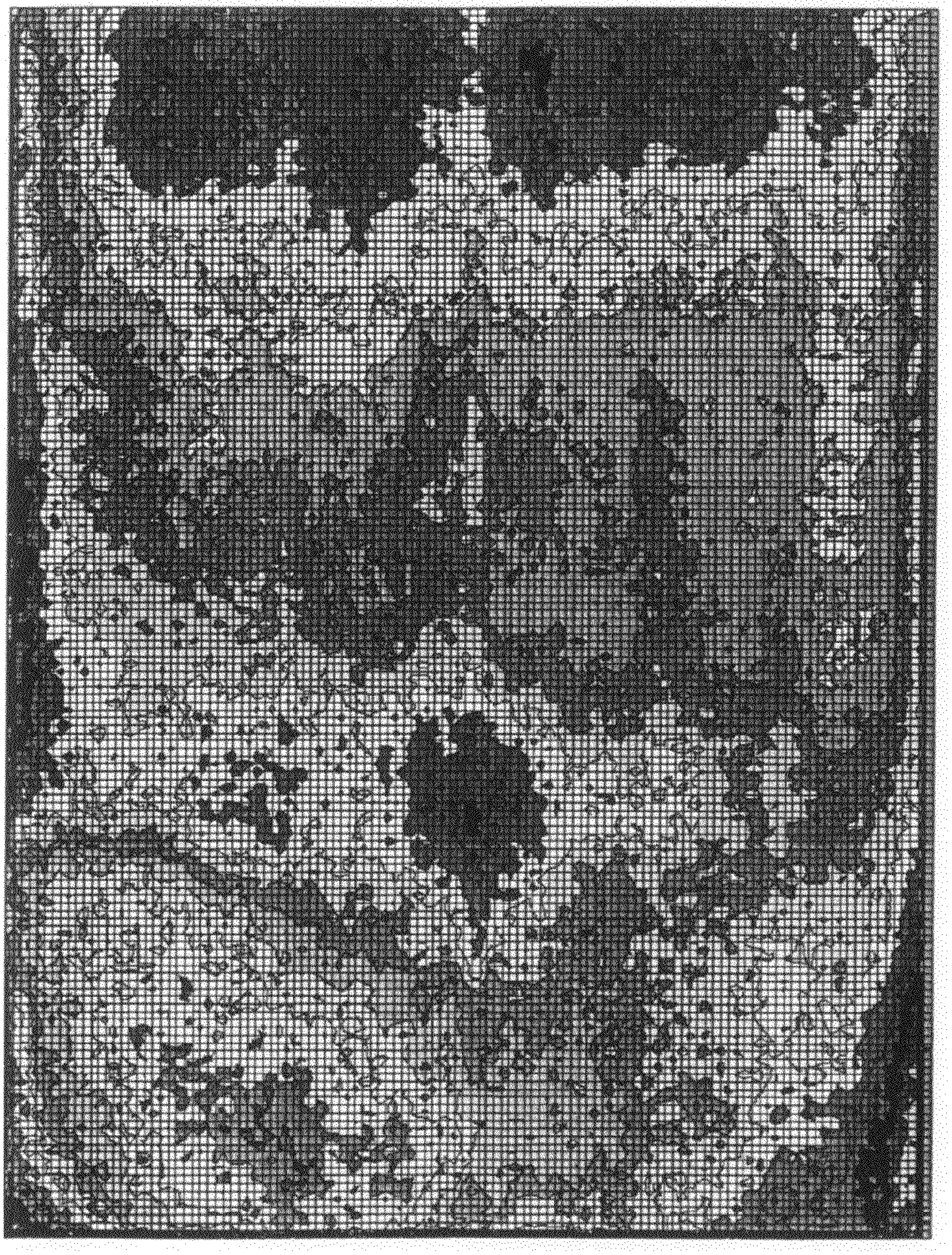
FIG. 24 is an illustration of a 2D map for unevenness correction.
Figure 25:
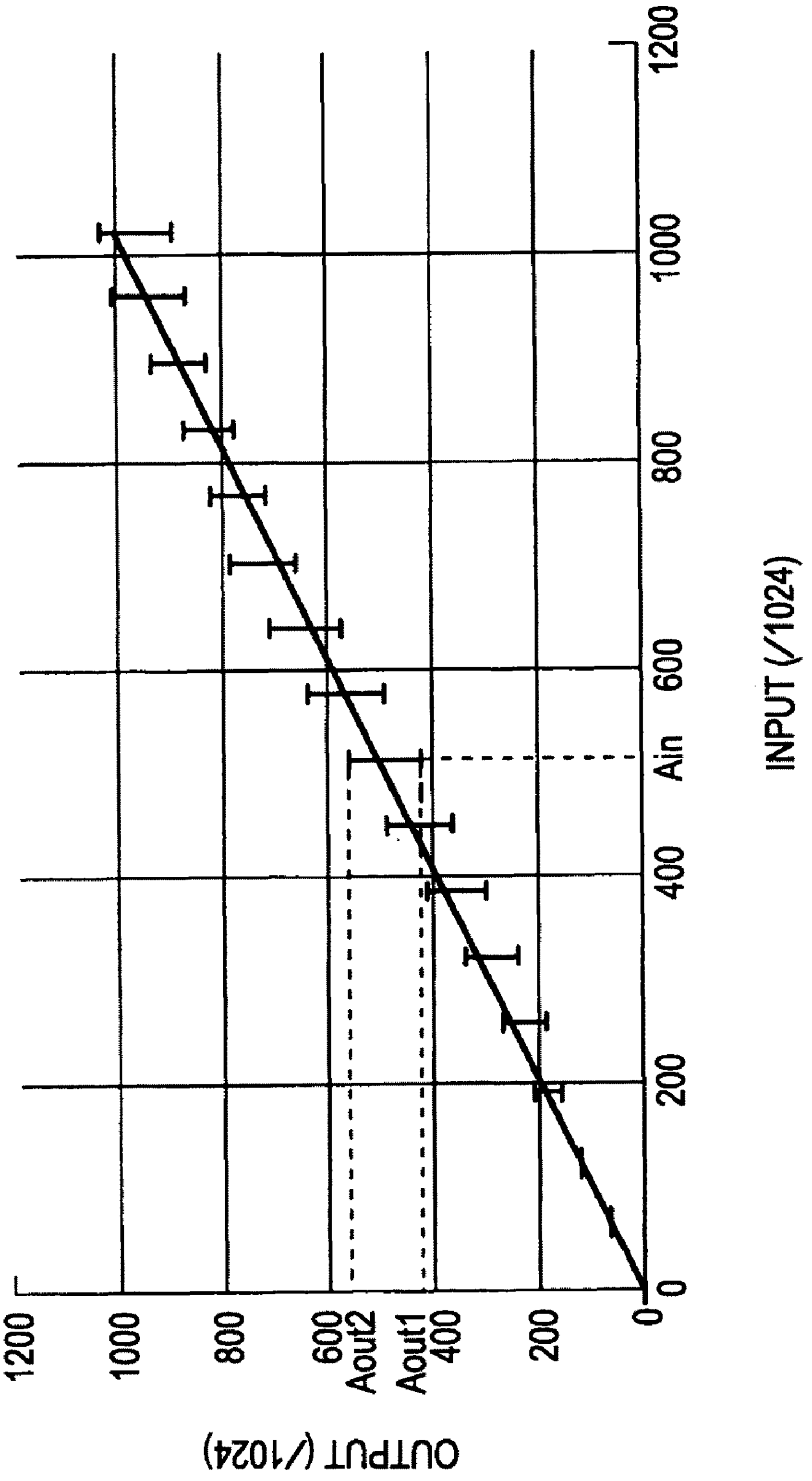
FIG. 25 is a diagram illustrating a relationship between an input value and a correction value of a correction table.
Figure 26:
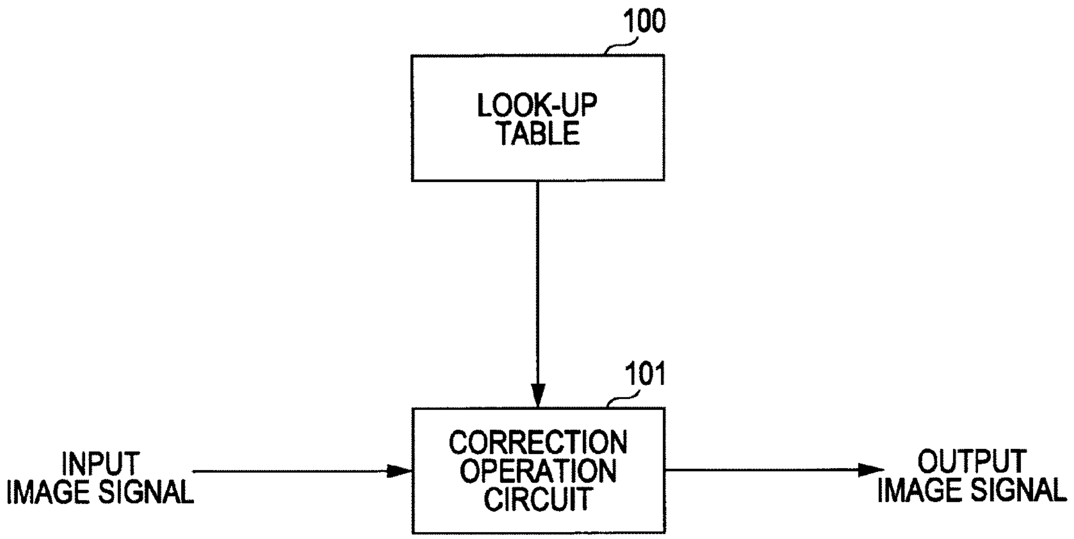
FIG. 26 is a diagram illustrating a configuration for correction.

Each of correction operation units 10R, 10G and 10B for performing the correction operation including the interpolation operation includes the operation circuit configuration shown in FIG. 23. That is, as shown in FIG. 23, subtracters 110, 111 and 115, multipliers 112 and 113, an adder 114 and a divider 116 are included.

When the image signal value (input grayscale value) Zin is input as the R signal, the correction operation circuit 10R reads a correction operation value from two lookup tables corresponding to the input signal value Zin from the R LUT unit 11R, reads the representative input values of the two lookup tables from the register 12R, and calculates and outputs the image signal value (output grayscale value) Zout as the correction value using these values.

Similarly, the correction operation circuit 10G calculates and outputs the image signal value Zout as the correction value using the image signal value Zin as the G signal, the value read from the G LUT unit 11G and the value read from the register 12G.

Similarly, the correction operation circuit 10B calculates and outputs the image signal value Zout as the correction value using the image signal value Zin as the B signal, the value read from the B LUT unit 11B and the value read from the register 12B.

The subtracter 110 subtracts the input grayscale value (the representative input value as the Z coordinate value) Zin2L of the lookup table TB(m−1) from the input grayscale value Zin (Zin−Zin2L).

The subtracter 111 subtracts the input grayscale value Zin from the input grayscale value (the representative input value as the Z coordinate value) Zin2U of the lookup table TB(m) (Zin2U−Zin).

The multiplier 112 multiplies the output (Zin−Zin2L) of the subtracter 110 and the correction value (output grayscale value) Zout2U of the lookup table TB(m) (Zout2U×(Zin−Zin2L)).

The multiplier 113 multiplies the output (Zin2U−Zin) of the subtracter 111 and the correction value (output grayscale value) Zout2L of the lookup table TB(m−1) (Zout2L×(Zin2U−Zin)).

The adder 114 adds the outputs of the multipliers 112 and 113 ((Zout2U×(Zin−Zin2L)+(Zout2L×(Zin2U−Zin)).

The subtracter 115 subtracts the input grayscale value (Z coordinate value) Zin2L of the lookup table TB(m−1) from the input grayscale value (Z coordinate value) Zin2U of the lookup table TB(m) (Zin2U−Zin2L).

The divider 116 divides the output of the adder 114 by the output of the subtracter 115. The output of the divider 116 becomes the result of operating Equation 1.

That is, if the input grayscale value is not the representative input value, the corrected output grayscale value can be obtained by the interpolation operation as described above.

Even when the input grayscale value is the representative input value, it is processed by the operation circuit of FIG. 23 without modification. For example, if the input grayscale value Zin is the representative input value Zin2L, Equation 1 becomes $$Zout=\{Zout2U\times 0+Zout2L\times(Zin2U-Zin2L)\}/(Zin2U-Zin2L)=Zout2L.$$

That is, the correction value Zout2L read from the lookup table TB(m−1) of the representative input value Zin2L becomes the output grayscale value without modification.

In addition, for example, if the input grayscale value Zin is the representative input value Zin2U, Equation 1 becomes Zout={Zout2U×(Zin2U−Zin2L)+Zout2L×0}/(Zin2U−Zin2L)=Zout2U. That is, the correction value Zout2U read from the lookup table TB(m) of the representative input value Zin2U becomes the output grayscale value without modification.

Accordingly, the corrected R output, G output and B output can be obtained by the correction operation circuits 10R, 10G and 10B.

By setting the correction value as described above, if the display operation of the display panel 1 is performed based on the corrected R output, G output and B output as the output grayscale value, it is possible to perform a display such that the luminance unevenness or chromaticity unevenness of the panel are not perceived.

In addition, in particular, in the high-luminance area, the luminance does not deteriorate after adjustment.

Although the embodiments of the present invention are described, the present invention is not limited to the above-described embodiments and various modification examples may be used in addition to the above-described examples.

For example, although the correction value (V+ΔV) is stored in the lookup table in the above-described examples, the correction value may be stored as ΔV and the correction operation circuits 10R, 10G and 10B may perform the operation of (V+ΔV) using the correction value ΔV. In this case, as the process of calculating the correction value of FIG. 21, the correction value is obtained as ΔV in step F103 and is written in the lookup table in step F104.

The present application contains subject matter related to that disclosed in Japanese Priority Patent Application JP 2008-299714 filed in the Japan Patent Office on Nov. 25, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of calculating a correction value used when signal value correction is performed with respect to an image signal supplied to a display panel, the method comprising the steps of:

setting a target luminance value, which is not uniform in an overall surface of the display panel, as a target luminance value of one image signal value such that at least a portion of a distribution of target luminance values at each plane position of the display panel becomes a curved distribution; and calculating a correction value at each plane position of the display panel using luminance observed at each plane position of the display panel when one image signal value is given to the overall surface of the display panel and the target luminance value at each plane position of the display panel.

2. The method according to claim 1, wherein each of a plurality of representative values selected from a minimum grayscale value to a maximum grayscale value of the display panel becomes one image signal value, and the correction value at each plane position of the display panel is calculated corresponding to the image signal value as each of the representative values.

3. The method according to claim 2, wherein the target luminance value of one image signal value at each plane position of the display panel is set so as to be distributed in a range which does not exceed a maximum luminance value observed when one image signal is given to the overall surface of the display panel.

4. The method according to claim 3, wherein the distribution of the target luminance value of one image signal value at each plane position of the display panel becomes a curved distribution in which four corner portions of the panel have a low luminance value, as compared with the center portion of the panel.

5. The method according to claim 3, wherein the distribution of the target luminance value of one image signal value at each plane position of the display panel becomes a curved distribution in which left and right portions of the panel have a low luminance value, as compared with the center portion of the panel.

6. The method according to claim 3, wherein the distribution of the target luminance value of one image signal value at each plane position of the display panel has a uniform distribution area, in which the target luminance value is uniform, in a central portion of the panel, and has a curved distribution in a portion other than the central portion of the panel.

7. The method according to claim 2, wherein the distribution of the target luminance value of one image signal value at each plane position of the display panel is set so as to become a curved distribution represented by a curve obtained by reducing a frequency of a curve of a variation in luminance value at each plane position of the display panel observed when one image signal value is given to the overall surface of the display panel.

8. The method according to claim 2, wherein the target luminance value of one image signal value at each plane position of the display panel is set in a range in which an image signal value after the correction using the correction value does not exceed a maximum grayscale value of the display panel.

9. A display device comprising:

a display unit which performs an image display on a display panel by a supplied image signal;

a memory table unit having a plurality of reference tables respectively corresponding to a plurality of representative values as an image signal value, the reference tables each storing a correction value at each plane position of the display panel in advance; and a correction operation unit which calculates a corrected image signal value as the image signal supplied to the display panel by an operation using an input image signal value and the correction value read from a reference table corresponding to the input image signal value in the memory table unit, wherein the correction value stored in each of the reference tables is calculated at each plane position of the display panel using luminance observed at each plane position of the display panel when one image signal value is given to an overall surface of the display panel and a target luminance value to each plane position of the display panel, after a target luminance value which is not uniform in the overall surface of the display panel is set as a target luminance value of one image signal value such that at least a portion of a distribution of the target luminance value at each plane position of the display panel becomes a curved distribution.

* * * * *